(12) United States Patent
Jeong et al.

(10) Patent No.: US 12,717,380 B2
(45) Date of Patent: Aug. 25, 2026

(54) ELECTRONIC DEVICE INCLUDING FLEXIBLE DISPLAY

(71) Applicant: SAMSUNG ELECTRONICS CO., LTD., Suwon-si (KR)

(72) Inventors: Hoyoung Jeong, Suwon-si (KR); Hyunggwang Kang, Suwon-si (KR); Myunghoon Kwak, Suwon-si (KR); Junhyuk Kim, Suwon-si (KR); Hojin Jung, Suwon-si (KR); Baekeun Cho, Suwon-si (KR); Hyoungtak Cho, Suwon-si (KR); Soyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 327 days.

(21) Appl. No.: 18/115,278

(22) Filed: Feb. 28, 2023

(65) Prior Publication Data

US 2023/0205264 A1 Jun. 29, 2023

Related U.S. Application Data

(63) Continuation of application No. PCT/KR2022/012129, filed on Aug. 12, 2022.

(30) Foreign Application Priority Data

Oct. 8, 2021 (KR) ........................ 10-2021-0134178

(51) Int. Cl.
*G06F 1/16* (2006.01)
*G01R 33/07* (2006.01)
*H04M 1/02* (2006.01)

(52) U.S. Cl.
CPC ........... *G06F 1/1624* (2013.01); *G01R 33/07* (2013.01); *G06F 1/1652* (2013.01);
(Continued)

(58) Field of Classification Search
CPC .... H04M 1/02; H04M 1/0206; H04M 1/0208; H04M 1/0235–0245;
(Continued)

(56) References Cited

U.S. PATENT DOCUMENTS 7,330,025 B1 * 2/2008 Beach ................ G01R 31/2893 324/762.02
7,907,121 B2 3/2011 Jacobs et al.
(Continued)

FOREIGN PATENT DOCUMENTS

CN 202074941 U * 12/2011
CN 110099198 A * 8/2019 ............... G02B 7/08
(Continued)

OTHER PUBLICATIONS

Extended European Search Report dated Dec. 4, 2024 issued in European Patent Application No. 22878708.1.
(Continued)

*Primary Examiner* — Patrick F Marinelli
(74) *Attorney, Agent, or Firm* — Nixon & Vanderhye P.C.

(57) ABSTRACT

An electronic device according to an embodiment may include: a housing including a first housing and a second housing slidably connected to the first housing; a flexible display including a first area and a second area extending from the first area and configured to be drawn into or out of the housing as the second housing slides; a support plate disposed inside the electronic device and coupled to the second housing and configured to slide, wherein the support plate includes at least one magnet disposed in an area of the support plate such that an N-pole and an S-pole are aligned in a first direction in which the second housing slides; a Hall sensor structure including at least one Hall sensor disposed inside the first housing adjacent to the at least one magnet and configured to measure a magnetic field of the at least one
(Continued)

magnet, wherein Hall sensors of the Hall sensor structure are disposed along the first direction while respective Hall sensors are spaced apart from each other by a first distance; and at least one processor electrically connected to the Hall sensor structure, wherein the processor may be configured to: determine a moving distance by which the second housing slides with respect to the first housing based on the magnetic field acquired by the Hall sensor structure via the at least one magnet.

20 Claims, 21 Drawing Sheets

(52) U.S. Cl.
CPC ........ *G06F 1/1677* (2013.01); *H04M 1/0237* (2013.01); *H04M 1/0241* (2013.01); *H04M 2250/12* (2013.01)

(58) Field of Classification Search
CPC .. H04M 1/0266–0269; H04M 2250/12; G06F 1/1624; G06F 1/1652; G06F 1/1677
See application file for complete search history.

(56) References Cited

U.S. PATENT DOCUMENTS

| | | | | |
|---|---|---|---|---|
| 8,816,701 | B2 * | 8/2014 | Liu | H04M 1/0245 345/173 |
| 9,293,111 | B2 | 3/2016 | Kwack et al. | |
| 9,571,614 | B2 * | 2/2017 | Jin | G06F 1/1626 |
| 10,474,202 | B2 * | 11/2019 | Kitade | G06F 1/1677 |
| 10,557,723 | B2 | 2/2020 | Lee et al. | |
| 10,861,628 | B2 | 12/2020 | Wang | |
| 11,184,987 | B1 | 11/2021 | Jung et al. | |
| 11,365,986 | B2 * | 6/2022 | Kim | G01D 5/145 |
| 11,579,657 | B2 * | 2/2023 | Hu | A45C 11/00 |
| 11,977,419 | B2 * | 5/2024 | Kim | G06F 1/1698 |
| 12,513,237 | B2 * | 12/2025 | Ahn | H04M 1/0235 |
| 12,513,239 | B2 * | 12/2025 | Jung | H04M 1/72469 |
| 2004/0127266 | A1 * | 7/2004 | Aagaard | G06F 1/1637 455/575.1 |
| 2005/0272487 | A1 * | 12/2005 | Lee | H04M 1/0245 455/575.4 |
| 2011/0227855 | A1 | 9/2011 | Kim et al. | |
| 2012/0241304 | A1 * | 9/2012 | Liu | G06F 1/1624 200/600 |
| 2013/0127917 | A1 | 5/2013 | Kwack et al. | |
| 2013/0314762 | A1 | 11/2013 | Kwack et al. | |
| 2015/0115943 | A1 * | 4/2015 | Jin | G06F 1/1677 324/226 |
| 2018/0198899 | A1 * | 7/2018 | Lee | G06F 1/1652 |
| 2018/0284964 | A1 | 10/2018 | Kang et al. | |
| 2020/0020470 | A1 * | 1/2020 | Wang | G06F 1/1624 |
| 2021/0116959 | A1 * | 4/2021 | Heo | G06F 1/1601 |
| 2022/0065660 | A1 * | 3/2022 | Kim | G06F 1/1624 |
| 2022/0148477 | A1 | 5/2022 | Han et al. | |
| 2022/0335869 | A1 | 10/2022 | Kwak et al. | |
| 2022/0418123 | A1 * | 12/2022 | Liu | H04M 1/0237 |
| 2023/0049731 | A1 * | 2/2023 | Kim | G06F 1/1652 |
| 2023/0110166 | A1 * | 4/2023 | Chung | G06F 3/0488 361/679.01 |
| 2023/0205264 | A1 * | 6/2023 | Jeong | G01R 33/072 361/679.27 |
| 2024/0048025 | A1 * | 2/2024 | Cho | H02K 7/116 |
| 2024/0243683 | A1 * | 7/2024 | Kang | G06F 1/1624 |
| 2024/0348710 | A1 * | 10/2024 | Kang | H04M 1/0268 |
| 2025/0023228 | A1 * | 1/2025 | An | H01Q 1/243 |
| 2025/0126726 | A1 * | 4/2025 | Liu | G09F 9/301 |

FOREIGN PATENT DOCUMENTS

| | | | | |
|---|---|---|---|---|
| CN | 111294432 | | 6/2020 | |
| CN | 112583968 | | 3/2021 | |
| CN | 212992368 | | 4/2021 | |
| CN | 212992368 U | * | 4/2021 | |
| CN | 115248669 | | 10/2022 | |
| CN | 219434087 U | * | 7/2023 | |
| CN | 222498251 U | * | 2/2025 | B66B 1/3492 |
| JP | 2009-193588 | | 8/2009 | |
| KR | 10-2013-0130496 | | 12/2013 | |
| KR | 10-2018-0060625 | | 6/2018 | |
| KR | 10-2020-0009998 | | 1/2020 | |
| KR | 10-2258022 | | 5/2021 | |
| KR | 10-2021-0113805 | | 9/2021 | |
| KR | 10-2021-0146095 | | 12/2021 | |
| KR | 10-2023-0045942 | | 4/2023 | |
| WO | 2020/256183 | | 12/2020 | |
| WO | WO-2020256183 A1 | * | 12/2020 | F16C 11/04 |
| WO | WO-2021182740 A1 | * | 9/2021 | G01B 21/16 |
| WO | WO-2021254008 A1 | * | 12/2021 | |

OTHER PUBLICATIONS

International Search Report for PCT/KR2022/012129, mailed Nov. 24, 2022, 8 pages.

Written Opinion of the ISA for PCT/KR2022/012129, mailed Nov. 24, 2022, 4 pages.

Korean Office Action dated Feb. 6, 2026 issued in Korean Patent Application No. 10-2021-0134178 and English translation, 25 pp.

Indian Office Action dated May 19, 2026 issued in Indian Patent Application No. 202447018558 and English translation, 7 pp.

Japanese Office Action dated May 25, 2026 issued in Japanese Patent Application No. 2024-520627 and English translation, 10 pp.

* cited by examiner

<100A>

ELECTRONIC DEVICE INCLUDING FLEXIBLE DISPLAY

CROSS-REFERENCE TO RELATED APPLICATIONS

This application is a continuation of International Application No. PCT/KR2022/012129 designating the United States, filed on Aug. 12, 2022, in the Korean Intellectual Property Receiving Office and claiming priority to Korean Patent Application No. 10-2021-0134178, filed on Oct. 8, 2021, in the Korean Intellectual Property Office, the disclosures of which are incorporated by reference herein in their entireties.

BACKGROUND

Field

The disclosure relates to an electronic device including a flexible display.

Description of Related Art

With the development of technology, various types of electronic devices have been developed. For example, the distribution rate of devices including displays, such as computers, tablet PCs, or mobile phones, have increased, and demands from users for newer and more diverse functions have increased. In order to meet the increasing distribution rate and demands from users, electronic devices including new types of displays have been developed.

However, in the case of an electronic device including a display, as the size of the display increases, there was a limit in that it is also necessary to increase the size of the housing of the electronic device. Accordingly, electronic devices capable of satisfying customer needs such as portability and convenience while overcoming the limitation have been developed.

As a representative example, an electronic device may include a flexible display. With the electronic device including the flexible display, it is possible to secure portability through the contraction of the display by causing a portion of the display to be drawn into the housing of the electronic device. In addition, the electronic device including the flexible display may provide convenience to a user by providing a wide screen when the display is drawn out of the housing.

An electronic device including a flexible display may be understood as a device having a rollable display that is drawn into or drawn out of a housing. An electronic device including a rollable display, or simply a rollable device, may provide a user interface (UI) and a user experience (UX) optimized for each changing size of the display.

However, in order to provide an optimized UI and UX for each changing screen, the electronic device may be required to accurately sense the changing size of the display. For example, the electronic device may be required to accurately determine a state in which a portion of the display is drawn into the housing and a state in which the display is drawn out of the housing.

The electronic device may include various sliding sensing techniques. For example, a sensing technique using an infrared (IR) proximity sensor or a time of flight (TOF) sensor may be applied to the electronic device. However, the sensing technique using the IR proximity sensor may have a limitation in accuracy in short-distance measurement. In addition, the sensing technique using the TOF sensor may have a limitation in the structural design of the inside of the electronic device. Therefore, in general, a method of using a Hall integrated circuit (IC) to perform a measurement using a change in a magnetic field of a magnet may be mainly used. However, in the method of using a Hall IC, an error may occur due to an external magnetic force or a magnetic field of an electronic component inside the electronic device. Therefore, in the electronic device that adopts the method of using a Hall IC, it may be difficult to accurately sense the changing size of the display.

SUMMARY

Embodiments of the disclosure provide an electronic device that adopts a method for accurately sensing the size of a display area of a flexible display.

An electronic device according to various example embodiments of the disclosure may include: a housing including a first housing and a second housing slidably connected to the first housing; a flexible display including a first area and a second area extending from the first area and configured to be drawn into or out of the housing as the second housing slides; a support plate disposed inside the electronic device and coupled to the second housing and configured to slide, wherein the support plate includes at least one magnet disposed in an area of the support plate wherein an N-pole and an S-pole are aligned in a first direction in which the second housing slides; a Hall sensor structure including a Hall sensor disposed inside the first housing adjacent to the at least one magnet and configured to measure a magnetic field of the at least one magnet, wherein Hall sensors of the Hall sensor structure are disposed along the first direction while respective Hall sensors are spaced apart from each other by a first distance; and at least one processor electrically connected to the Hall sensor structure, wherein the processor may be configured to: determine a moving distance by which the second housing slides with respect to the first housing based on the magnetic field acquired by the Hall sensor structure via the at least one magnet.

An electronic device according to various example embodiments of the disclosure may include: a housing including a first housing and a second housing slidably connected to the first housing; a flexible display including a first area and a second area extending from the first area and configured to be drawn into or out of the housing as the second housing slides; a support plate disposed inside the electronic device and coupled to the second housing and configured to slide, wherein the support plate includes at least one magnet disposed in an area of the support plate wherein an N-pole and an S-pole are aligned in a first direction in which the second housing slides; a Hall sensor structure including a Hall sensor disposed inside the first housing adjacent to the at least one magnet and configured to measure a magnetic field of the at least one magnet, wherein Hall sensors of the Hall sensor structure are disposed along the first direction while the Hall sensors are spaced apart from each other by a first distance; and at least one processor electrically connected to the Hall sensor structure, wherein the at least one magnet may have a length shorter than the first distance between the hall sensors, and is longer than one half of the first distance, and wherein the processor may be configured to: determine a moving distance by which the second housing slides with respect to the first housing based on the magnetic field acquired by the Hall sensor structure via the at least one magnet.

According to various example embodiments disclosed herein, an electronic device including a flexible display is capable of accurately determining a changing size of a display using a change in a magnetic flux direction according to a movement of a magnet.

According to various example embodiments, it is possible to provide an electronic device including a flexible display, in which while adopting a method of using a Hall IC method, the electronic device minimizes and/or reduces the influence of noise due to an external magnetic force or other magnetic electronic components inside the electronic device.

In addition, various effects directly or indirectly identified through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In connection with the description of the drawings, the same or similar components may be denoted by the same or similar reference numerals.

DETAILED DESCRIPTION

Hereinafter, various example embodiments of the disclosure will be described in greater detail with reference to the accompanying drawings. However, it shall be understood that it is not intended to limit the disclosure to specific embodiments, and that the disclosure includes various modifications, equivalents, and/or alternatives of the embodiments of the disclosure.

Figure 1:
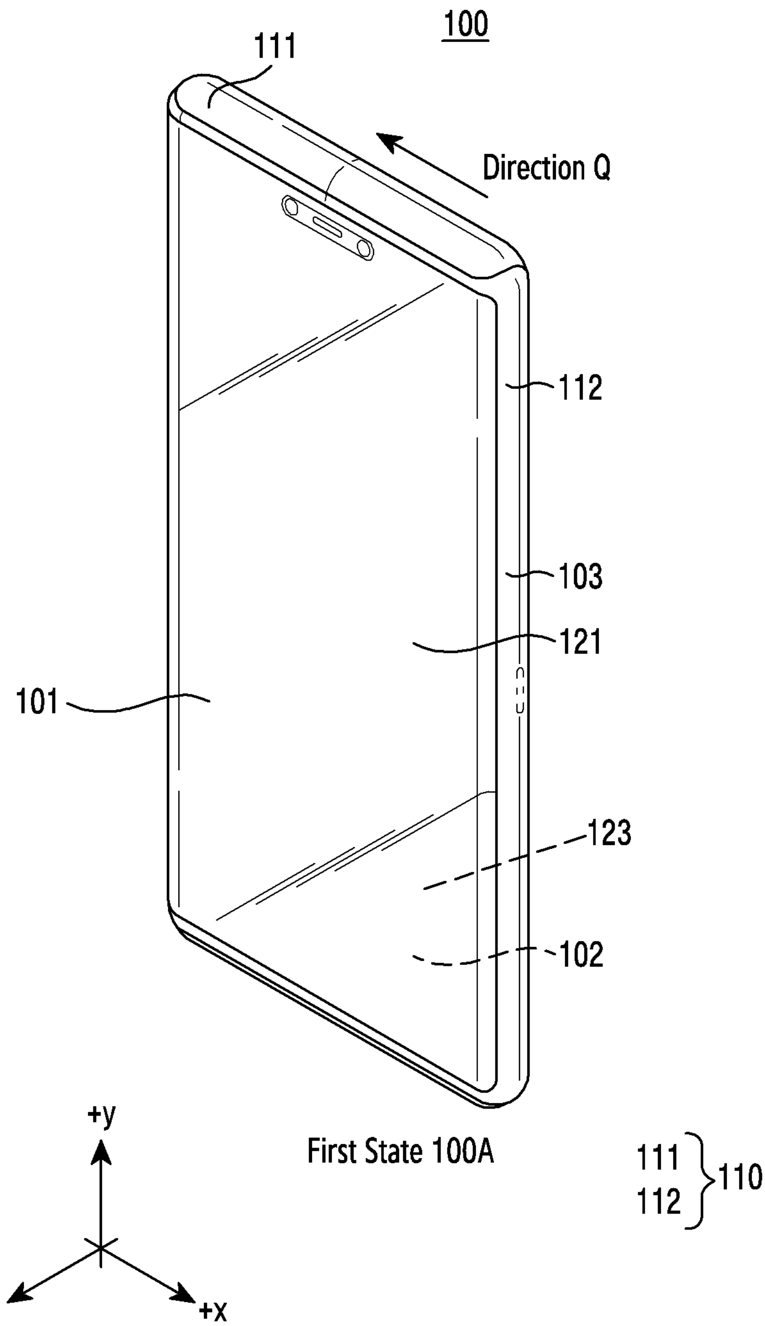
FIG. 1 is a front perspective view illustrating a first state (e.g., a contracted state) of an electronic device according to various embodiments.

FIG. 1 is a front perspective view illustrating a first state (e.g., a contracted state) of an electronic device according to various embodiments.

Figure 2:
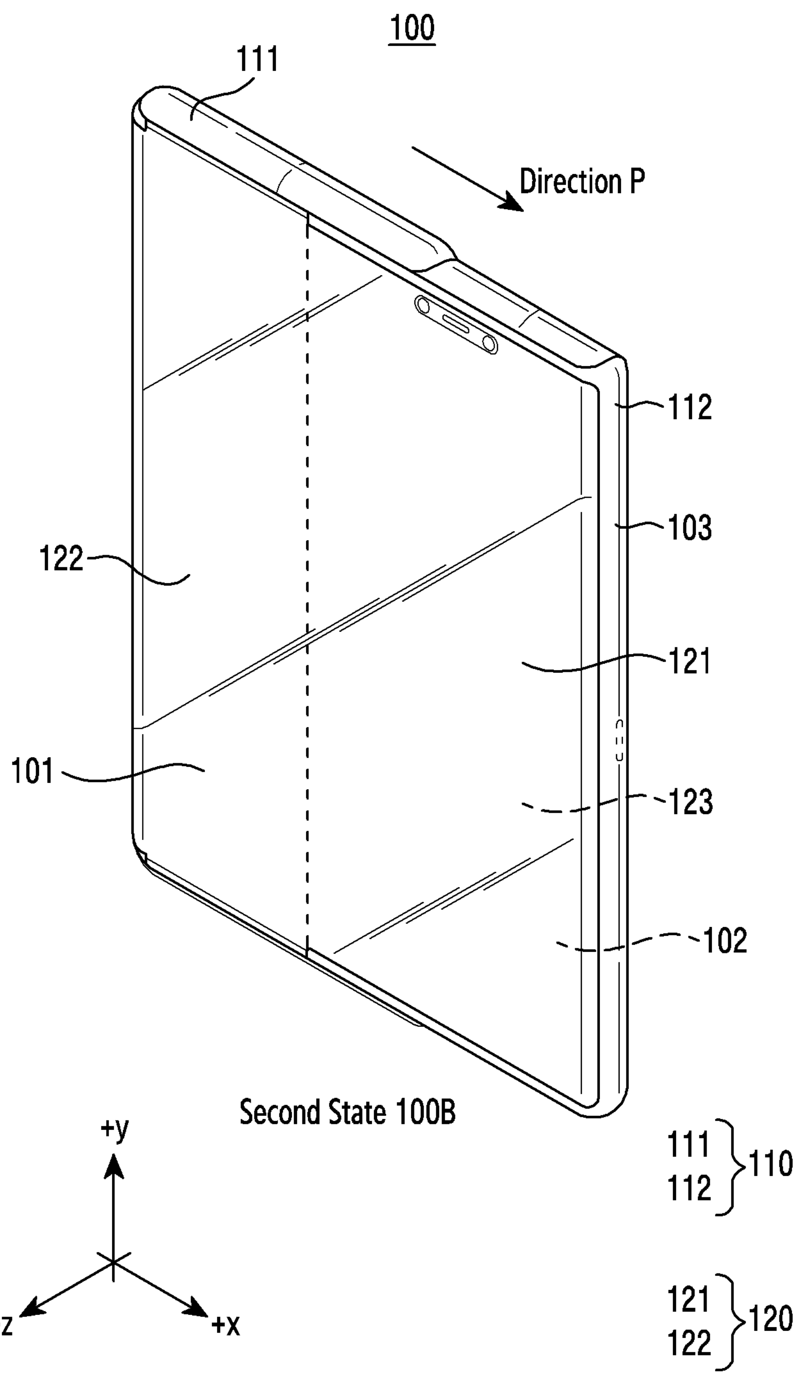
FIG. 2 is a front perspective view illustrating a second state (e.g., an expanded state) of the electronic device according to various embodiments.

FIG. 2 is a front perspective view illustrating a second state (e.g., an expanded state) of the electronic device according to various embodiments.

According to various embodiments disclosed herein, a surface oriented in substantially the same direction as a first direction (e.g., the +z direction) in which at least a portion (e.g., a first area 121) of a flexible display 120 positioned outside the electronic device 100 is oriented may be defined as the front surface 101 of the electronic device 100, and a surface oriented in substantially the same direction as a second direction (e.g., −z direction) opposite to the first direction may be defined as the rear surface 102 of the electronic device 100. In addition, a surface surrounding the space between the front surface 101 and the rear surface 102 may be defined as the side surface 103 of the electronic device 100.

According to an embodiment, a flexible display 120 may be disposed on at least a portion of the electronic device 100. According to an embodiment, the flexible display 120 may be disposed to include at least a portion of a flat shape and at least a portion of a curved shape. According to an embodiment, on the front surface of the electronic device 100, the flexible display 120 and a housing 110 surrounding at least a portion of the edge of the flexible display 120 may be disposed.

According to an embodiment, the housing 110 may form a partial area of the front surface 101, the rear surface 102, and the side surface 103 of the electronic device 100. In an embodiment, the front surface 101 of the electronic device 100 may refer to the surface of the electronic device 100 that is oriented in the +z direction in FIGS. 1 and 2. In an embodiment, the rear surface 102 of the electronic device 100 may refer to the surface of the electronic device 100 that is oriented in the −z direction in FIGS. 1 and 2. In an embodiment, the side surface 103 of the electronic device 100 may refer to a surface interconnecting the front surface 101 and the rear surface 102 of the electronic device 100. According to another embodiment, the housing 110 may form a partial area of the side surface 103 and the rear surface 102 of the electronic device 100.

According to an embodiment, the housing 110 may include a first housing 111 and a second housing 112 coupled to the first housing 111 to be movable with respect to the first housing 111 within a predetermined range.

According to an embodiment, the flexible display 120 may include a first area 121 that is capable of being coupled to the second housing 112 and a second area 122 that is capable of extending from the first area 121 and capable of being drawn into the electronic device 100.

According to an embodiment, the electronic device 100 may have a first state 100A and a second state 100B. For example, the first state 100A and the second state 100B of the electronic device 100 may be determined depending on the moving distance of the second housing 112 with respect to the first housing 111, and the state of the electronic device 100 may be changed between the first state 100A and the second state 100B by a user's manipulation or mechanical operation.

According to an embodiment, the first state 100A of the electronic device 100 may refer to the state before the housing 110 is expanded. The second state 100B of the electronic device 100 may refer to the state in which the housing 110 is expanded.

For example, the first state 100A may refer to the state in which the second housing 112 of the electronic device 100 is drawn into the housing 110. For example, the second housing 112 may be drawn in in the direction Q of FIG. 1.

According to an embodiment, the second state 100B may refer to the state in which the second housing 112 of the electronic device 100 is drawn out of the housing 110. For example, the second housing 112 may be drawn out in the direction P of FIG. 2.

According to an embodiment, when the state of the electronic device 100 is switched from the first state 100A to the second state 100B according to the movement of the second housing 112 in the direction P, the second area 122 of the flexible display 120 is capable of being drawn out (or exposed) from the interior to the exterior of the electronic device 100. According to an embodiment, when the flexible display 120 is drawn out, it may refer, for example, to the flexible display 120 being viewable from the exterior of the electronic device 100.

According to an embodiment, when the electronic device 100 is switched from the second state 100B to the first state 100A according to the movement of the second housing 112 in the direction Q, the second area 122 of the flexible display 120 is capable of being drawn into the electronic device 100. According to an embodiment, when the flexible display 120 is drawn into, it may refer, for example, to at least an area (e.g., the second area 122) of the flexible display 120 not being viewable from the exterior of the electronic device 100.

Figure 3:
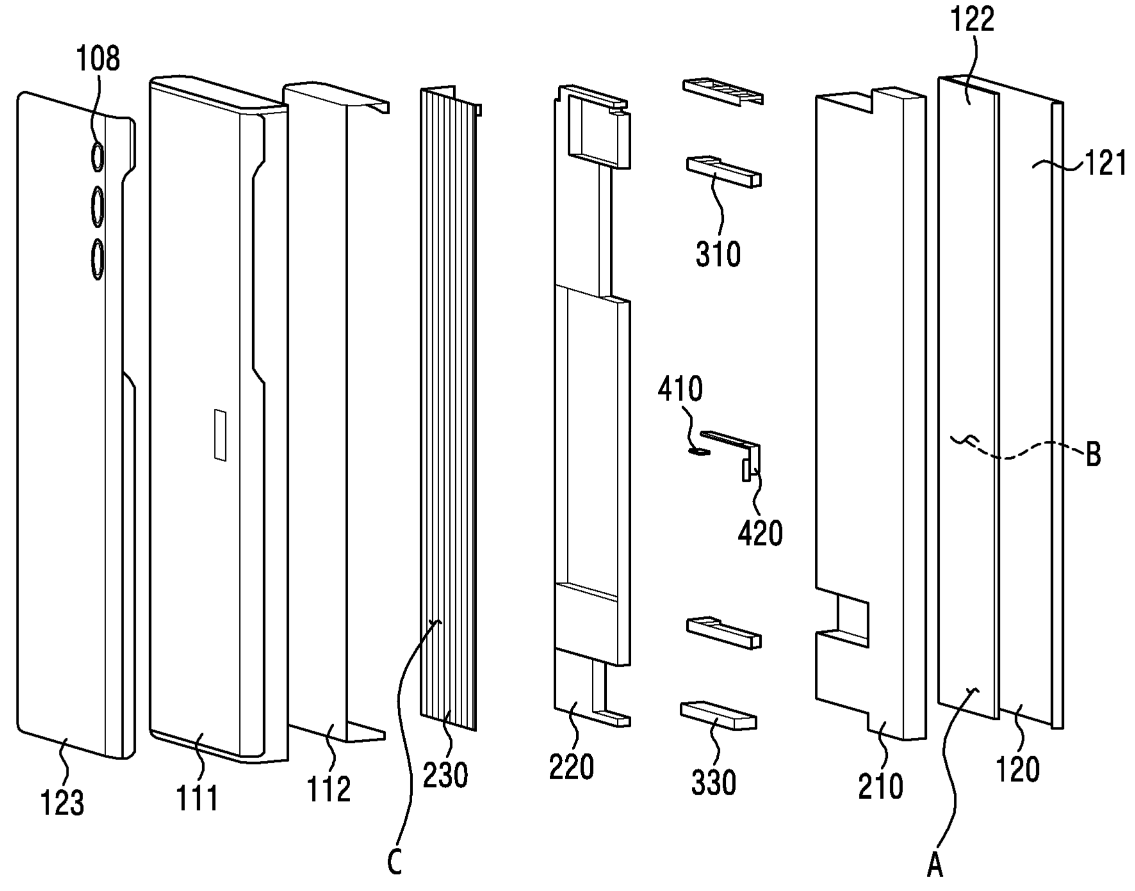
FIG. 3 is an exploded perspective view of an electronic device according to various embodiments.
Figure 3:
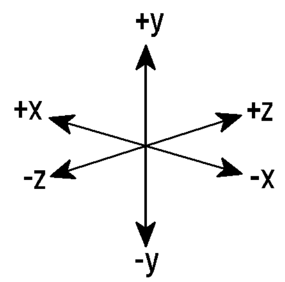

FIG. 3 is an exploded perspective view illustrating of an electronic device according to various embodiments.

In a description to be made with reference to FIG. 3, a description overlapping those made with reference to FIGS. 1 and 2 may not be repeated.

According to an embodiment, the electronic device 100 may include a first housing 111, a second housing 112, and/or a flexible display 120.

According to an embodiment, the electronic device 100 may further include a rear cover 123, a support plate 220, a fixed housing 210, multiple bars 230, and a Hall sensor structure 420, and/or at least one magnet 410.

According to an embodiment, the rear cover 123 may be disposed on one surface of the first housing 111. For example, the rear cover 123 may be disposed on the rear surface (e.g., the rear surface 102 in FIG. 1) of the electronic device 100. For example, the rear cover 123 may be disposed on a surface of the first housing 111 oriented in the first direction (e.g., the −z direction).

According to an embodiment, the rear cover 123 may be provided as a cover that protects the rear surface (e.g., the rear surface 102 in FIG. 1) of the electronic device 100.

According to an embodiment, the rear cover 123 may be provided with a plurality of holes. According to an embodiment, the plurality of holes may correspond to the camera holes 108 disposed in the rear surface of the electronic device 100. According to an embodiment, a portion of a camera disposed inside the electronic device 100 may be exposed to the exterior through the camera holes 108.

According to an embodiment, by disposing the rear cover 123 on the rear surface of the electronic device 100, the electronic device 100 may be protected from an external impact.

According to an embodiment, the electronic device 100 may include a fixed housing 210. According to an embodiment, a plurality of electronic components (e.g., a battery, a PCB, a camera, or a motor) may be disposed in the fixed housing 210. For example, the fixed housing 210 may provide a space for accommodating the plurality of electronic components.

According to an embodiment, the fixed housing 210 may be coupled to the first housing 111. According to another embodiment, the fixed housing 210 may be integrated with the first housing 111. According to an embodiment, by coupling the fixed housing 210 to the first housing 111, the fixed housing 210 may be fixed without sliding inside the electronic device 100.

According to an embodiment, the fixed housing 210 may be disposed on one surface of the first housing 111 that is oriented in a second direction (e.g., the +z direction) opposite to the first direction (e.g., −z direction). For example, the fixed housing 210 may be disposed between the first housing 111 and the flexible display 120.

According to an embodiment, the flexible display 120 may be disposed on one surface of the fixed housing 210 that is oriented in the second direction (e.g., the +z direction). For example, the first area 121 of the flexible display 120 that is always exposed to the exterior may be disposed on the first surface of the fixed housing 210 that is oriented in the second direction (e.g., +z direction) opposite to the first direction.

According to an embodiment, the support plate 220 may be coupled to the second housing 112. According to an embodiment, by coupling the support plate 220 to the second housing 112, the support plate 220 is slidable into or out of the first housing 111 in response to the movement of the second housing 112.

According to an embodiment, when the electronic device 100 is in the first state 100A, the support plate 220 may be disposed on one surface of the fixed housing 210 that is oriented in the first direction (e.g., −z direction). For example, the support plate 220 may be disposed between the fixed housing 210 and the first housing 111. According to an embodiment, when the electronic device 100 is in the second state 100B, the first housing 111 may be disposed on the one surface of the fixed housing 210.

For example, when the electronic device 100 is in the first state 100A, one surface of the support plate 220 oriented in the second direction (e.g., the +z direction) may face the fixed housing 210. According to an embodiment, in the first state 100A, the other surface of the support plate 220 oriented in the first direction (e.g., −z direction) may face the multiple bars 230 to be described in greater detail below.

According to an embodiment, the electronic device 100 may further include multiple bars 230 disposed between the second housing 112 and the support plate 220 in the first state 100A.

According to an embodiment, the multiple bars 230 may be coupled to the second area 122 of the flexible display 120. For example, the multiple bars 230 may be attached to the rear surface of the second area 122 of the flexible display 120, wherein the rear surface of the second area 122 is not exposed to the exterior. For example, referring to FIG. 3, although the flexible display 120 and the multiple bars 230 are individually expressed, the rear surface B opposite to the front surface A of the second area 122 of the flexible display 120 may face the surfaces C of the multiple bars 230.

According to an embodiment, the support plate 220 may be connected to at least some of the multiple bars 230. According to an embodiment, by connecting the support plate 220 to at least some of the multiple bars 230, the multiple bars 230 may move on a predetermined path (rail) in response to the sliding of the support plate 220. According to an embodiment, as the multiple bars 230 move along the predetermined path, the electronic device 100 is switched from the first state 100A to the second state 100B, and the second area 122 of the flexible display 120 that faces surface A of the multiple bars 230 may be exposed to the exterior.

According to an embodiment, the multiple bars 230 may be attached to the rear surface of the second area 122 to support the second area 122 of the display 120. According to an embodiment, since the multiple bars 230 support the second area 122, in the electronic device 100, at least a portion of the second area 122 of the flexible display 120 may form a flat surface and/or a curved surface.

According to an embodiment, a Hall sensor structure 420 and at least one magnet 410 may be disposed between the support plate 220 and the fixed housing 210.

Various embodiments related to the at least one magnet 410 and the Hall sensor structure 420 will be described in greater detail below with reference to FIGS. 4 to 12.

According to an embodiment, a plurality of structures (e.g., guide members) may be disposed between the support plate 220 and the fixed housing 210.

According to an embodiment, a plurality of guide members may be provided between the support plate 220 and the fixed housing 210. For example, the plurality of guide members may include a first guide member 310, a second guide member (not illustrated) to be described in greater detail below with reference to FIG. 4, or a third guide member 330.

According to an embodiment, since the first guide member 310 and the third guide member 330 are provided inside the electronic device 100, the second housing 112 is slidable in the first direction (e.g., the +x or −z direction) with respect to the first housing 111. For example, the first guide member 310 and the third guide member 330 may provide a path such that the second housing 112 slides in a predetermined first direction with respect to the first housing 111.

According to an embodiment, various embodiments related to the first guide member 310, the second guide member (not illustrated), and the third guide member 330 will be described in greater detail below with reference to FIGS. 4 to 8.

Figure 4:
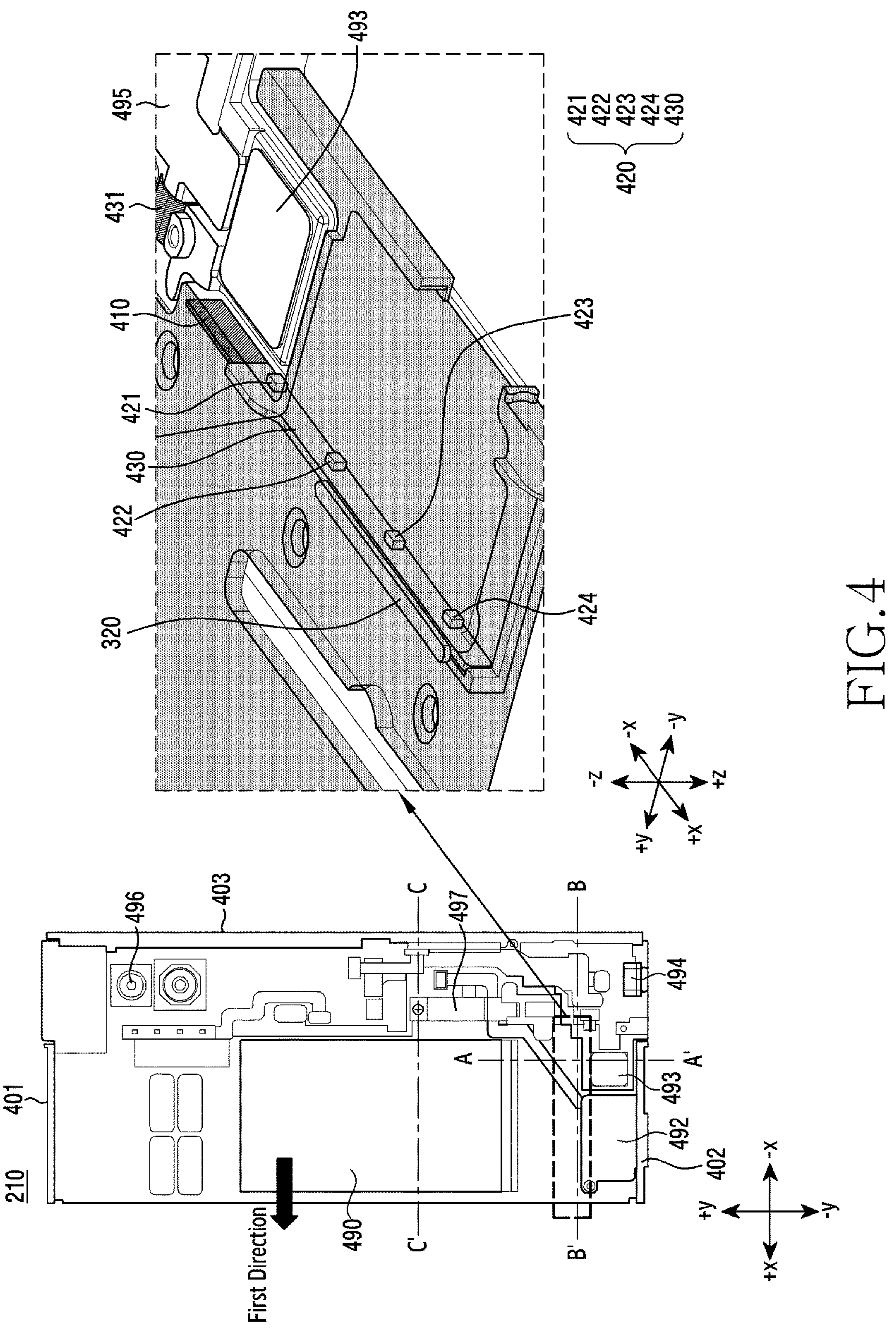
FIG. 4 is a diagram illustrating the interior of the electronic device according to various embodiments

FIG. 4 is a diagram illustrating the interior of an electronic device according to various embodiments.

According to an embodiment, FIG. 4 is a view illustrating a fixed housing 210 of an electronic device 100.

According to an embodiment, as described above, the fixed housing 210 may be coupled to the first housing 111. According to an embodiment, the fixed housing 210 may be integrated with the first housing 111.

According to an embodiment, the fixed housing 210 includes a first edge 401, a second edge 402 parallel to the first edge 401, and a third edge 403 interconnecting the first edge 401 and the second edge 402.

According to an embodiment, the first edge 401 may correspond to the edge of the upper end (e.g., in the +y-axis direction) of the electronic device 100. According to an embodiment, the second edge 402 may correspond to the edge of the lower end (e.g., in the −y-axis direction) of the electronic device 100.

According to an embodiment, in the fixed housing 210, a Hall sensor structure 420, a connector 431 electrically connected to the Hall sensor structure 420, and/or a PCB 495 electrically connected to the connector 431 may be disposed.

According to an embodiment, at least one magnet 410 may be disposed in an area of a support plate (e.g., 220 in FIG. 3) adjacent to the Hall sensor structure 420.

In addition, according to an embodiment, in the fixed housing 210, at least one of a battery 490, a motor 497 that enables the second housing 112 to slide with respect to the first housing 111, a microphone 493, a universal serial bus (USB) 494, a camera 496, and a touch sensor 492 may be disposed.

According to an embodiment, the camera 496 may be disposed in an area adjacent to the first edge 401 and the third edge 403. As described above, a portion of the camera 496 may be exposed to the exterior through a camera hole (e.g., 108 in FIG. 3) provided in the rear cover 123.

According to an embodiment, the touch sensor 492 may be disposed in an area adjacent to the second edge 402.

According to an embodiment, the USB 494 may be disposed in an area adjacent to the second edge 402 and the third edge 403.

According to an embodiment, the microphone 493 may be disposed in an area adjacent to the third edge 403 and between the touch sensor 492 and the USB 494.

According to an embodiment, the Hall sensor structure 420 and/or the connector 431 may be disposed in an area of the fixed housing 210 adjacent to the second edge 402. For example, the Hall sensor structure 420 may be disposed in an area of the fixed housing 210 between the battery 490 and the microphone 493 and/or the touch sensor 492.

According to an embodiment, the at least one magnet 410 may be disposed in an area of the support plate 220 between the battery 490 and the microphone 493 and/or the touch sensor 492.

Referring to FIG. 4, according to an embodiment, the Hall sensor structure 420 may be disposed in the fixed housing 210 and/or the first housing 111.

According to an embodiment, the Hall sensor structure 420 may include a sensor FPCB 430, a first Hall sensor 421, a second Hall sensor 422, a third Hall sensor 423, and/or a fourth Hall sensor 424.

However, the number of Hall sensors of the Hall sensor structure 420 is not limited thereto. For example, the Hall sensor structure 420 may further include a fifth Hall sensor. According to another embodiment, in the Hall sensor structure 420, the fourth Hall sensor 424 may be omitted.

According to an embodiment, respective Hall sensors of the Hall sensor structure 420 may be disposed to be spaced apart from each other by a first distance D. For example, a first Hall sensor of the Hall sensor structure 420 may be disposed to be spaced apart from a second Hall sensor by the first distance D in a first direction (e.g., the +x direction). According to an embodiment, the first direction (e.g., the x direction or the −x direction) may refer to a direction in which the second housing 112 slides with respect to the first housing 111.

According to an embodiment, a example embodiment related to the first distance D of the Hall sensor structure 420 will be described in greater detail below with reference to FIG. 9 and FIGS. 16 to 18.

According to an embodiment, the first housing 111 and/or the fixed housing 210 may be provided with a second guide member 320 protruding in a second direction (e.g., the −z direction) toward the rear surface of the electronic device 100.

According to an embodiment, the second guide member 320 may be disposed in an area adjacent to the second edge 402. For example, the second guide member 320 may be disposed in an area of the fixed housing 210 and/or the first housing 111 adjacent to the microphone 493 and the touch sensor 492.

According to an embodiment, the Hall sensor structure 420 may be disposed on the second guide member 320. For example, the Hall sensor structure 420 may be fixedly attached to the second guide member 320. In an example, the sensor FPCB 430 of the Hall sensor structure 420 may be fixedly attached to the second guide member 320.

According to an embodiment, the first Hall sensor 421, the second Hall sensor 422, the third Hall sensor 423, and/or the fourth Hall sensor 424 may be disposed on the sensor FPCB 430.

According to an embodiment, an example embodiment related to the sensor FPCB 430 will be described in greater detail below with reference to FIG. 5.

According to an embodiment, since the Hall sensor structure 420 is fixedly attached to the second guide member 320, it is possible to prevent and/or reduce the Hall sensor structure 420 from shaking inside the electronic device 100. For example, it is possible to prevent and/or reduce the first Hall sensor 421, the second Hall sensor 422, the third Hall sensor 423, and/or the fourth Hall sensor disposed on the sensor FPCB 430 from shaking inside the electronic device 100.

According to an embodiment, by preventing/reducing the Hall sensor structure from shaking, the Hall sensor structure 420 may more accurately sense the strength of the magnetic field formed by the at least one magnet measure the strength of the magnetic field formed by the at least one magnet 410 in the Hall sensor structure 420 compared to the case where the Hall sensor structure 420 is not fixed to the second guide member 320. For example, the Hall sensor structure 420 according to an embodiment may sense a magnetic field with reduced noise.

According to an embodiment, since the Hall sensor structure 420 more accurately senses the strength of the magnetic field, the electronic device 100 may more accurately determine the changing size of the flexible display 120.

According to an embodiment, the at least one magnet 410 may be disposed adjacent to the Hall sensor structure 420 fixed to the second guide member 320. According to an embodiment, since the at least one magnet 410 is disposed adjacent to the Hall sensor structure 420, the Hall sensor structure 420 is capable of sensing the strength of the magnetic field formed by the at least one magnet 410.

According to an embodiment, since the Hall sensor structure 420 senses the strength of the magnetic field, the electronic device 100 may determine the changing size of the flexible display 120.

For example, the processor of the electronic device 100 according to an embodiment is capable of determining the moving distance by which the second housing 112 slides with respect to the first housing 111 based on the magnetic field sensed and acquired by the Hall sensor structure 420.

Figure 5:
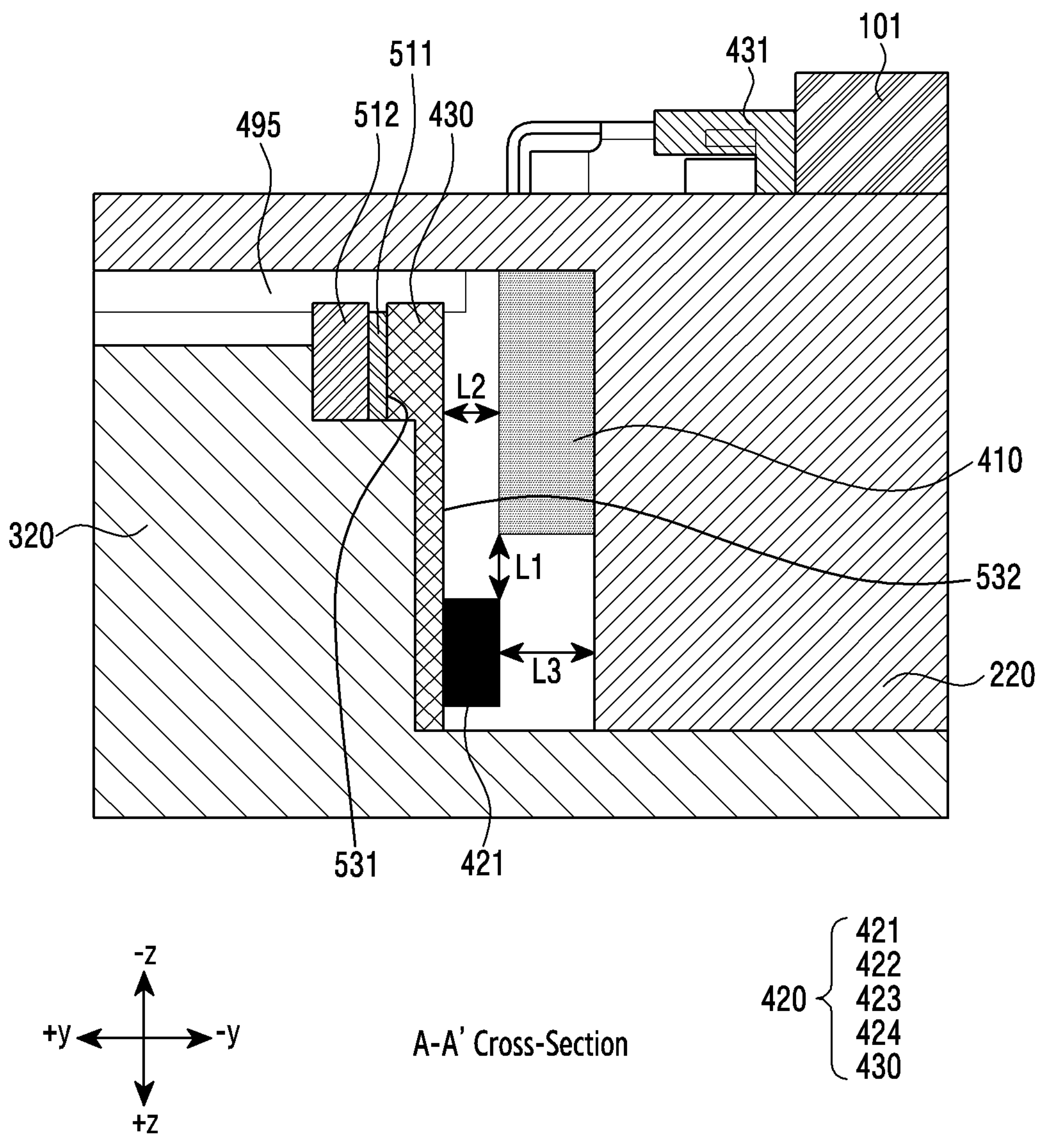
FIG. 5 is a cross-sectional view taken along line A-A' of FIG. 4, according to various embodiments.

FIG. 5 is a cross-sectional view taken along line A-A' of FIG. 4, according to various embodiments.

Referring to FIG. 5, according to an embodiment, at least one magnet 410 may be attached to the support plate 220 and/or the second housing 112. According to an embodiment, the at least one magnet 410 may be disposed in an area adjacent to the first guide member (not illustrated) provided on the support plate 220.

According to an embodiment, the at least one magnet 410 may be disposed to be perpendicular to the rear surface 102 of the electronic device 100. For example, the at least one magnet 410 may be disposed to be oriented in a direction (e.g., the +x direction or the −x direction) perpendicular to a direction (e.g., the −z direction) in which the N pole and the S pole are oriented toward the rear surface.

Referring to FIG. 5, the Hall sensor structure 420 according to an embodiment may be attached to the second guide member 320. According to an embodiment, a tape 512 may be disposed on the second guide member 320. In addition, according to an embodiment, an adhesive (e.g., an epoxy resin adhesive) 511 may be disposed on the tape 512. According to an embodiment, the Hall sensor structure 420 may be disposed on the adhesive 511.

Therefore, according to an embodiment, the Hall sensor structure 420 may be attached to the second guide member 320 by the adhesive 511 and the tape 512.

According to an embodiment, the sensor FPCB 430 of the Hall sensor structure 420 may include a first surface 531 and a second surface 532 opposite to the first surface 531.

According to an embodiment, the first surface 531 may correspond to the surface facing the second guide member 320. For example, the first surface 531 may face the adhesive 511. According to an embodiment, by providing the adhesive 511 and the tape 512 on the first surface 531, the sensor FPCB 430 of the Hall sensor structure 420 is attachable to the second guide member 320.

According to an embodiment, the first Hall sensor 421, the second Hall sensor 422, the third Hall sensor 423, and/or the fourth Hall sensor 424 of the Hall sensor structure 420 may be disposed on the sensor FPCB 430. In an example, the first Hall sensor 421, the second Hall sensor 422, the third Hall sensor 423, and/or the fourth Hall sensor 424 may be disposed on the second surface 532 of the sensor FPCB 430.

According to an embodiment, the first Hall sensor 421, the second Hall sensor 422, the third Hall sensor 423, and/or the fourth Hall sensor 424 of the Hall sensor structure 420 may be electrically connected to the sensor FPCB 430.

According to an embodiment, the Hall sensor structure 420 may be disposed to be oriented in a first direction (e.g., the +x direction or the −x direction). For example, the first Hall sensor 421, the second Hall sensor 422, the third Hall sensor 423, and/or the fourth Hall sensor 424 of the Hall sensor structure 420 may be arranged in a row in the first direction (e.g., the +x direction or the −x direction). For example, the first Hall sensor 421, the second Hall sensor 422, the third Hall sensor 423, and/or the fourth Hall sensor 424 of the Hall sensor structure 420 may be arranged along a first axis (e.g., the x axis).

According to an embodiment, one surface of the first Hall sensor 421 may face a portion of the second surface 532 of the sensor FPCB 430. According to an embodiment, the other surface of the first Hall sensor 421 may be oriented in a second direction (e.g., the −y direction).

According to an embodiment, one surface of the second Hall sensor 422 may face a portion of the second surface 532 of the sensor FPCB 430. According to an embodiment, the other surface of the second Hall sensor 422 may be oriented in the second direction (e.g., the −y direction).

According to an embodiment, the third Hall sensor 423 and/or the fourth Hall sensor 424 may be provided to be oriented in substantially the same direction as the first Hall sensor 421.

According to an embodiment, the Hall sensor structure 420 may be disposed to face one surface of the at least one magnet 410. For example, the one surface of the at least one magnet 410 may be disposed to be oriented in a first direction (e.g., the +y direction). In an example, the second surface 532 of the sensor FPCB 430 of the Hall sensor structure 420 may be disposed to be oriented in the second direction (e.g., the −y direction).

According to an embodiment, the adhesive 511 may have a thickness of about 0.3 mm. According to an embodiment, the sensor FPCB 430 may have a thickness of about 0.2 mm. According to an embodiment, the first Hall sensor 421, the second Hall sensor 422, the third Hall sensor 423, and/or the fourth Hall sensor 424 of the Hall sensor structure 420 may have a thickness of about 0.55 mm.

In various embodiments, the thicknesses of the adhesive 511, the sensor FPCB 430, and the Hall sensors of the Hall sensor structure 420 are not limited thereto. For example, the thickness of the first Hall sensor 421 may be thicker than 0.55 mm. According to another embodiment, the thickness of the first Hall sensor 421 may be thinner than 0.55 mm.

According to an embodiment, the Hall sensor structure 420 may be disposed adjacent to the at least one magnet 410 and the support plate 220. For example, a first distance L1 between the first Hall sensor 421 of the Hall sensor structure 420 and the at least one magnet 410 may be within about 0.2 mm to about 1.0 mm. According to an embodiment, the first distance L1 between the second Hall sensor 422 and the at least one magnet 410 may be within about 0.2 mm to about 1.0 mm. According to an embodiment, a second distance L2 between the sensor FPCB 430 and the at least one magnet 410 may be within about 0.2 mm to about 0.8 mm.

According to an embodiment, the first distance L1 between the at least one magnet 410 and the Hall sensor structure 420 may be within about 0.2 mm to about 1.0 mm.

In addition, according to an embodiment, a third distance L3 between the Hall sensor structure 420 and the support plate 220 may be within about 0.6 mm to about 1.2 mm.

According to an embodiment, when the third distance L3 between the Hall sensor structure 420 and the support plate 220 has a value within the range of about 0.6 mm to about 1.2 mm, it is possible to prevent and/or reduce the sensor structure 420 and the support plate 220 from colliding with each other in the electronic device 100.

However, the first distance L1, the second distance L2, and the third distance L3 are not limited to the above-mentioned ranges. For example, the third distance L3 may be greater than 1.2 mm. In another example, the third distance L3 may be closer than 0.6 mm.

Figure 6:
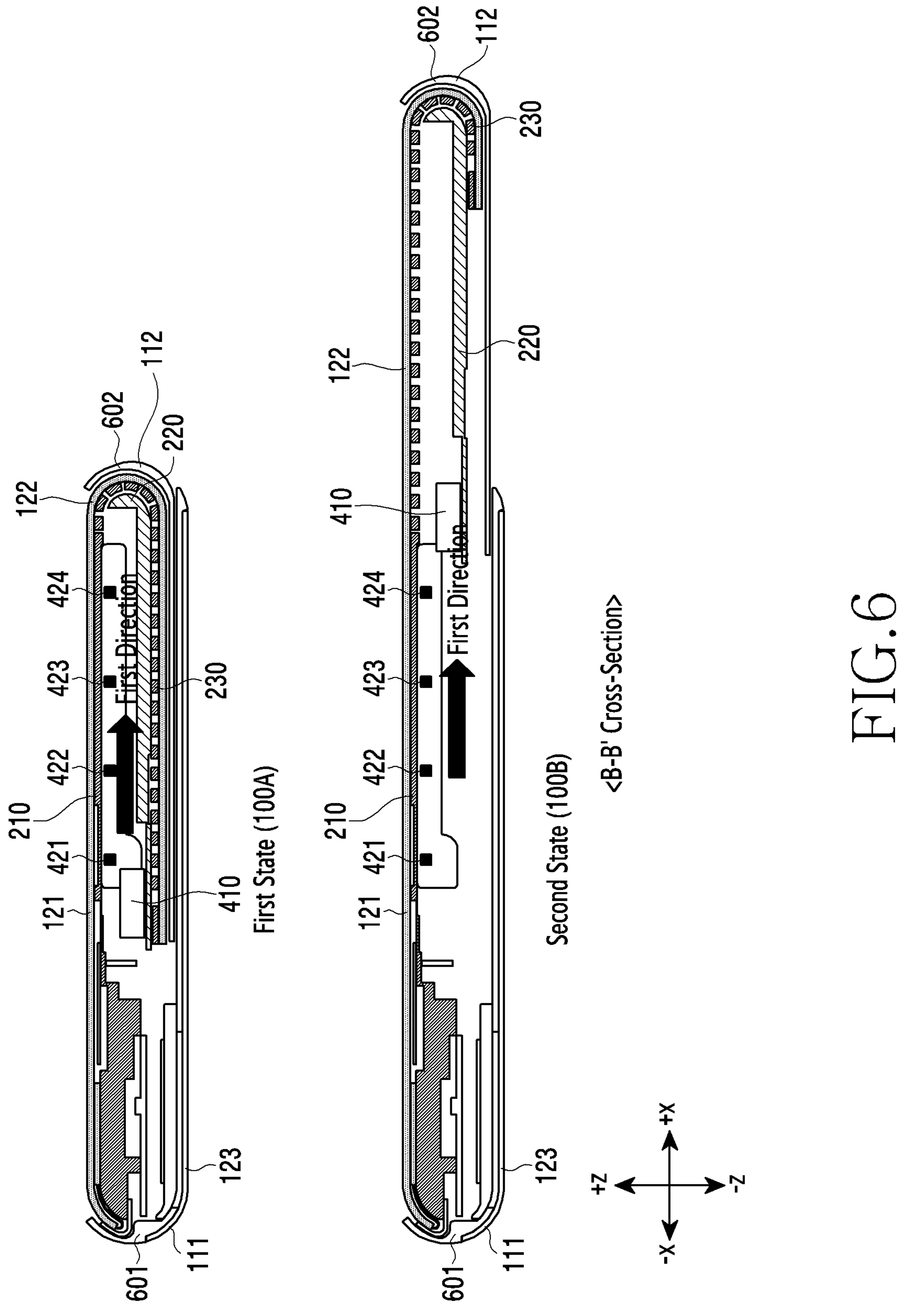
FIG. 6 is a cross-sectional view taken along line B-B' of FIG. 4, according to various embodiments.

FIG. 6 is a cross-sectional view taken along line B-B' of FIG. 4, according to various embodiments.

Figure 7:
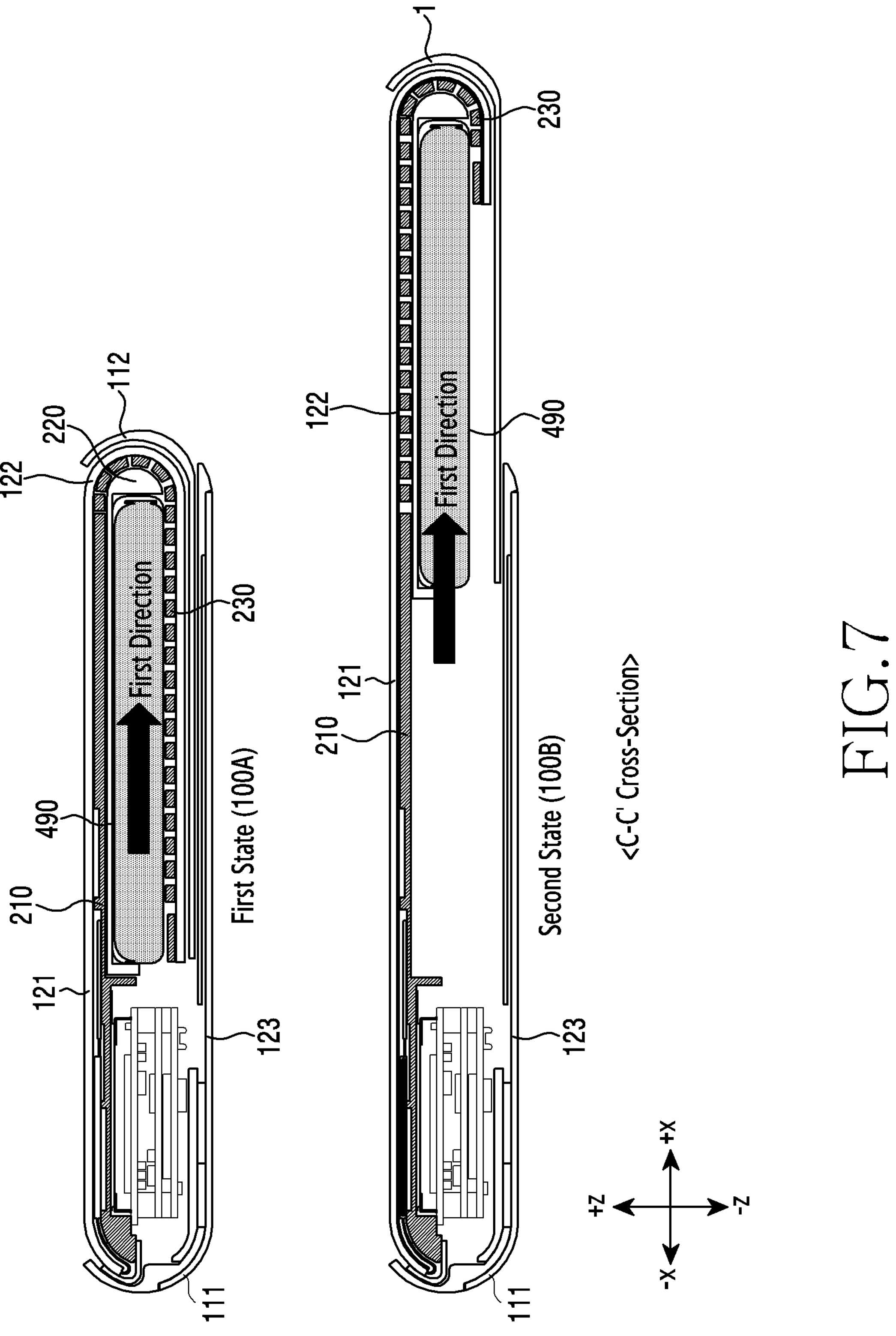
FIG. 7 is a cross-sectional view taken along line C-C' of FIG. 4, according to various embodiments.

FIG. 7 is a cross-sectional view taken along line C-C' of FIG. 4, according to various embodiments.

According to an embodiment, FIGS. 6 and 7 illustrate a process in which the at least one magnet 410, the battery 490, and the support plate 220 move inside the electronic device 100 between the first state 100A and the second state 100B of the electronic device 100 according to an embodiment.

According to an embodiment, the first housing 111 of the electronic device 100 may include a first side surface 601. For example, the first side surface 601 may correspond to the side surface fixed in the housing 110 of the electronic device 100.

According to an embodiment, the second housing 112 may include a second side surface 602. For example, the second side surface 602 may correspond to the side surface that slides in the housing 110 of the electronic device 100.

Referring to FIG. 6, according to an embodiment, the Hall sensor structure 420 may be disposed in an area inside the first housing 111 to overlap at least a portion of the first area 121 of the flexible display 120 when viewed in the z-axis direction. According to an embodiment, the Hall sensor structure 420 may be fixed inside the electronic device 100 without sliding by being disposed inside the first housing 111.

According to an embodiment, the Hall sensor structure 420 may be disposed along a first direction (e.g., the +x direction or the −x direction) in which the second housing 112 slides with respect to the first housing 111.

According to an embodiment, the Hall sensors of the Hall sensor structure 420 may be disposed to be spaced apart from each other. According to an embodiment, the Hall sensor structure 420 may include a first Hall sensor 421, a second Hall sensor 422, a third Hall sensor 423, and/or a fourth Hall sensor 424.

According to an embodiment, the first Hall sensor 421 may be located in an area of the first housing 111 and/or the fixed housing 210 adjacent to the first side surface 601. According to an embodiment, the second Hall sensor 422 may be located to be spaced apart from the first Hall sensor 421 by a predetermined distance. According to an embodiment, the third Hall sensor 423 may be located to be spaced apart from the second Hall sensor 422 by a predetermined distance. According to an embodiment, the fourth Hall sensor 424 may be located to be spaced apart from the third Hall sensor 423 by a predetermined distance and adjacent to the second side surface 602.

An embodiment related to the spaced distance between the Hall sensors of the Hall structures 420 and the at least one magnet 410 according to an embodiment will be described in greater detail below with reference to FIG. 9.

According to an embodiment, the at least one magnet 410 may be disposed on the second housing 112 and/or the support plate 220 as described above. For example, the at least one magnet 410 may be fixed to an area on the support plate 220.

According to an embodiment, as the support plate 220 coupled to the second housing 112 slides in the first direction (e.g., the +x direction or the −x direction), the at least one magnet 410 is also movable in the first direction.

According to an embodiment, the at least one magnet 410 may be arranged such that the N-pole and the S-pole are aligned in the first direction in which the second housing 112 slides. For example, the N pole and the S pole of the at least one magnet 410 may be arranged in a direction parallel to the direction in which the Hall sensor structure 420 is aligned.

According to an embodiment, the at least one magnet 410 may be disposed in an area on the support plate 220 adjacent to the first side surface 601. According to an embodiment, when the electronic device 100 is in the first state 100A, the at least one magnet 410 may be disposed in an area adjacent to the first Hall sensor 421 of the Hall sensor structure 420.

According to an embodiment, when the electronic device 100 is in the second state 100B, the at least one magnet 410 may be disposed in an area adjacent to the fourth Hall sensor 424 of the Hall sensor structure 420.

According to an embodiment, the at least one magnet 410 may be disposed to at least partially overlap the sensor FPCB 430 and/or the Hall sensor structure 420 when viewed in the second direction (e.g., the +y direction) perpendicular to the first direction (e.g., the +x direction or the −x direction).

According to an embodiment, since the at least one magnet 410 and the Hall sensor structure 420 are disposed adjacent to each other, the electronic device 100 may determine the changing size of the flexible display 120 more accurately than in the case where sensing is performed in the state in which the at least one magnet 410 and the Hall sensor structure 420 are disposed to be spaced apart from each other.

For example, the processor of the electronic device 100 according to an embodiment may determine more accurately the moving distance by which the second housing 112 slides with respect to the first housing 111 based on the magnetic field sensed and acquired by the Hall sensor structure 420, than in the case in which the moving distance is sensed in the state in which the at least one magnet 410 and the Hall sensor structure 420 are spaced apart from each other.

According to an embodiment, some of the multiple bars 230 may be located on one surface of the support plate 220 in the first state 100A. Referring to FIG. 6, the support plate 220 according to an embodiment may slide in the first direction (e.g., the +x direction or the −x direction) together with the multiple bars 230. For example, when the support plate 220 guides the multiple bars 230 in the first direction (e.g., the +x direction or the −x direction), the multiple bars 230 may slide in the first direction (e.g., the +x direction or the −x direction).

Referring to FIG. 7, the electronic device 100 may include a battery 490. In an example, the battery 490 may be disposed in the second housing 112 and/or on the support plate 220. For example, the battery 490 may be fixed to the second housing 112 and/or the support plate 220.

According to an embodiment, the battery 490 may slide in the first direction (e.g., the +x direction or the −x direction) together with the second housing 112 and/or the support plate 220.

Figure 8:
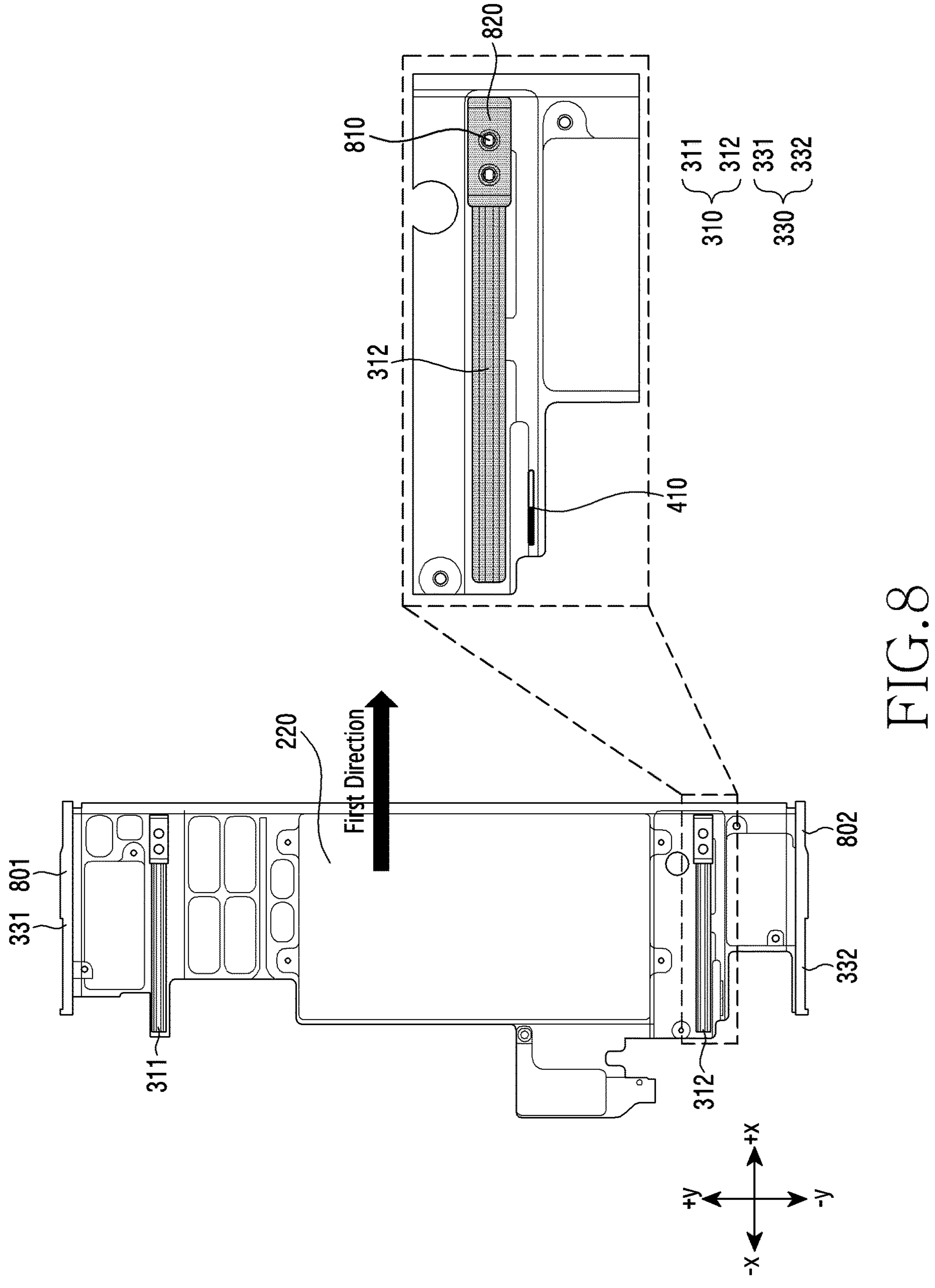
FIG. 8 is a diagram illustrating the interior of the electronic device according to various embodiments.

FIG. 8 is a diagram illustrating a portion of the interior of an electronic device according to various embodiments.

According to an embodiment, FIG. 8 is a view illustrating the front surface of the support plate 220 disposed inside the electronic device 100. According to an embodiment, the front surface of the support plate 220 may face the fixed housing (e.g., 210 in FIG. 3).

According to an embodiment, the support plate 220 may include a first edge 801 and a second edge 802 parallel to the first edge 801.

Referring to FIG. 8, according to an embodiment, the support plate 220 may include a first guide member 310 and a third guide member 330.

According to an embodiment, the first guide member 310 may include a first guide 311 adjacent to the first edge 801 and a second guide 312 adjacent to the second edge 802. According to an embodiment, the second guide 312 may be located in an area of the support plate 220 adjacent to the at least one magnet 410.

According to an embodiment, the third guide member 330 may include a first rail 331 adjacent to the first edge 801 and a second rail 332 adjacent to the second edge 802.

According to an embodiment, the first guide member 310 may be provided on a portion of the support plate 220. According to an embodiment, the first guide member 310 may be provided to protrude toward the front surface of the electronic device 100 (e.g., in the +z direction).

According to an embodiment, the fixed housing (e.g., 210 in FIG. 4) may include a fixing member 820.

According to an embodiment, a recess (not illustrated) may be provided in one surface of the fixing member 820. According to an embodiment, at least one through hole 810 may be provided in the other surface of the fixing member 820. For example, two through holes 810 may be provided in the other surface of the fixing member 820.

According to an embodiment, by inserting a fastening member into the at least one through hole 810 provided in the other surface of the fixing member 820, the fixing member 820 may be coupled to the fixed housing 210.

According to an embodiment, the first guide member 310 may be accommodated in the fixing member 820 fixed to the first housing 111. For example, the first guide member 310 may be accommodated in the recess provided in the one surface of the fixing member 820.

According to an embodiment, since the first guide member 310 is accommodated in the recess in the fixing member 820, the first guide member 310 may guide the support plate 220 to be slidable in the first direction (e.g., the +x direction or the −x direction).

According to an embodiment, the at least one magnet 410 may be disposed in an area of the support plate 220 adjacent to the first guide member 310. According to an embodiment, since the at least one magnet 410 is disposed in an area adjacent to the first guide member 310, the at least one magnet 410 may slide in the first direction without shaking.

According to an embodiment, referring to FIGS. 4, 5, and 7, the Hall sensor structure 420 may be disposed in an area of the first housing 111 and/or the fixed housing 210. According to an embodiment, the Hall sensor structure 420 may be disposed in an area of the first housing 111 adjacent to the first guide member 310 provided on the support plate 220. According to an embodiment, the hall sensors of the Hall sensor structure 420 may be arranged in a row along the first guide member 310 in an area of the first housing 111.

According to an embodiment, since the Hall sensors of the Hall sensor structure 420 may be arranged in a row along the first guide member 310, the at least one magnet 410 corresponding to the Hall sensor structure 420 may be fixed by the hall structure 420 and the magnetic field inside the electronic device 100 without shaking.

Accordingly, according to an embodiment, the Hall sensor structure 420 may sense the magnetic field while reducing the generation of noise.

Accordingly, the electronic device 100 according to an embodiment may accurately determine the changing size of the flexible display 120.

According to an embodiment, the third guide member 330 may be disposed on the first edge 801 and the second edge 802 of the support plate 220. According to an embodiment, a recess (not illustrated) may be provided in a portion of the third guide member 330.

According to an embodiment, the multiple bars 230 may be accommodated in the recess of the third guide member 330. According to an embodiment, the third guide member 330 in which the recess is provided may guide the multiple bars 230 to slide in the first direction.

According to an embodiment, since the third guide 330 guides the multiple bars 230 to slide in the first direction, it is possible to block the separation of the multiple bars 230 in the electronic device 100.

Figure 9:
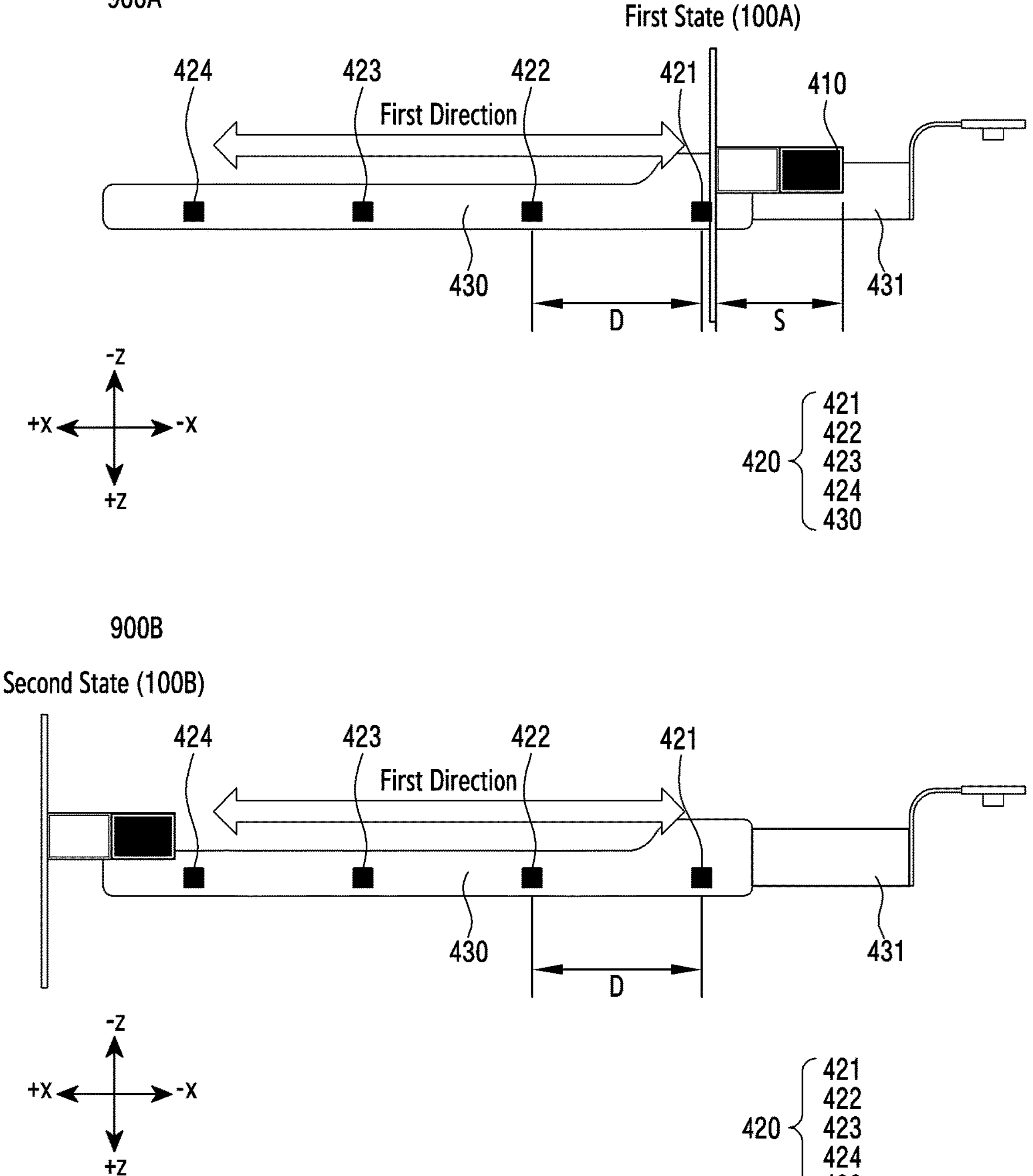
FIG. 9 is a diagram illustrating a Hall sensor structure and at least one magnet according to various embodiments.

FIG. 9 is a diagram illustrating a Hall sensor structure and at least one magnet according to various embodiments.

According to an embodiment, FIG. 9 illustrates an arrangement relationship between a Hall sensor structure 420 and at least one magnet 410 corresponding thereto when the electronic device 100 is in the first state 100A or the second state 100B.

For example, 900A of FIG. 9 is a view illustrating the arrangement relationship between the Hall sensor structure 420 and the at least one magnet 410 corresponding thereto when the electronic device 100 is in the first state 100A.

According to an embodiment, 900B of FIG. 9 is a view illustrating the arrangement relationship between the Hall sensor structure 420 and the at least one magnet 410 corresponding thereto when the electronic device 100 is in the second state 100B.

According to an embodiment, as the at least one magnet 410 slides with respect to the first housing (e.g., 111 in FIG. 1) of the second housing (e.g., 112 in FIG. 1), the at least one magnet 410 may move in a first direction (e.g., the +x direction or the −x direction).

According to an embodiment, the Hall sensor structure 420 may be disposed on the sensor FPCB 430. For example, the Hall sensor structure 420 may be electrically connected to the sensor FPCB 430.

According to an embodiment, one end of the sensor FPCB 430 may be electrically connected to the connector 431. According to an embodiment, the connector 431 may be electrically connected to a PCB (e.g., 495 in FIG. 4) provided in the first housing 111.

According to an embodiment, the Hall sensor structure 420 may include a first Hall sensor 421, a second Hall sensor 422, a third Hall sensor 423, and/or a fourth Hall sensor 424. According to an embodiment, the Hall sensor structure 420 may further include a sensor FPCB 430.

According to an embodiment, the Hall sensor structure 420 may include a first Hall sensor 421 disposed adjacent to the at least one magnet 410 when the electronic device 100 is in the first state 100A. According to an embodiment, the Hall sensor structure 420 may include a first Hall sensor 421 disposed at one end of the sensor FPCB 430. For example, the first Hall sensor 421 according to an embodiment may be disposed adjacent to the connector 431.

Referring to FIG. 9, each of the Hall sensors of the Hall sensor structure 420 may be spaced apart from a Hall sensor adjacent thereto. For example, respective Hall sensors of the Hall sensor structure 420 may be disposed on the sensor FPCB 430 to be spaced apart from each other by a first distance D.

According to an embodiment, a second Hall sensor 422 may be disposed to be spaced apart from a first Hall sensor 421 by the first distance D in the first direction (e.g., the +x direction). According to an embodiment, a third Hall sensor 423 may be disposed to be spaced apart from the second Hall sensor 422 by the first distance D in the first direction (e.g., the +x direction).

According to an embodiment, a fourth Hall sensor 424 may be disposed to be spaced apart from the third Hall sensor 423 by the first distance D in the first direction (e.g., the +x direction). In addition, according to an embodiment, the fourth Hall sensor 424 may be disposed adjacent to the other end of the sensor FPCB 430. According to an embodiment, when the electronic device 100 is in the first state 100A, the at least one magnet 410 may be disposed adjacent to the first Hall sensor 421. Furthermore, according to an embodiment, when the electronic device 100 is in the second state 100B, the at least one magnet 410 may be disposed adjacent to the fourth Hall sensor 424.

According to an embodiment, the length S of the at least one magnet 410 may be shorter than the first distance D between the Hall sensors of the Hall sensor structure 420. According to an embodiment, the length S of the at least one magnet 410 may be longer than ½ of the first distance D.

For example, the length S of the at least one magnet 410 according to an embodiment may be shorter than the first distance D between the Hall sensors of the Hall sensor structure 420 and longer than ½ of the first distance D.

According to an embodiment, since the length S of the at least one magnet 410 is shorter than the first distance D and longer than ½ of the first distance D, the resolution and sensing accuracy of the Hall sensor structure 420 may be improved. According to an embodiment, external noise may be reduced.

According to an embodiment, since resolution and accuracy are improved and noise is minimized and/or reduced, the electronic device 100 may more accurately determine the changing size of the flexible display 120.

According to an embodiment, the electronic device 100 may include at least one processor (not illustrated) electrically connected to the Hall sensor structure 420. According to an embodiment, the at least one processor (not illustrated) may determine the moving distance by which the second housing 112 slides with respect to the first housing 111. For example, the magnetic field acquired by the Hall sensor structure 420 via the at least one magnet 410 may be input to at least one processor (not illustrated) via the connector 431 and the PCB (e.g., 495 in FIG. 5) provided in the fixed housing 210.

According to an embodiment, the at least one processor (not illustrated) may determine the moving distance by which the second housing 112 slides with respect to the first housing 111 based on the magnetic field acquired by the Hall sensor structure 420 via the at least one magnet 410.

Figure 10A:
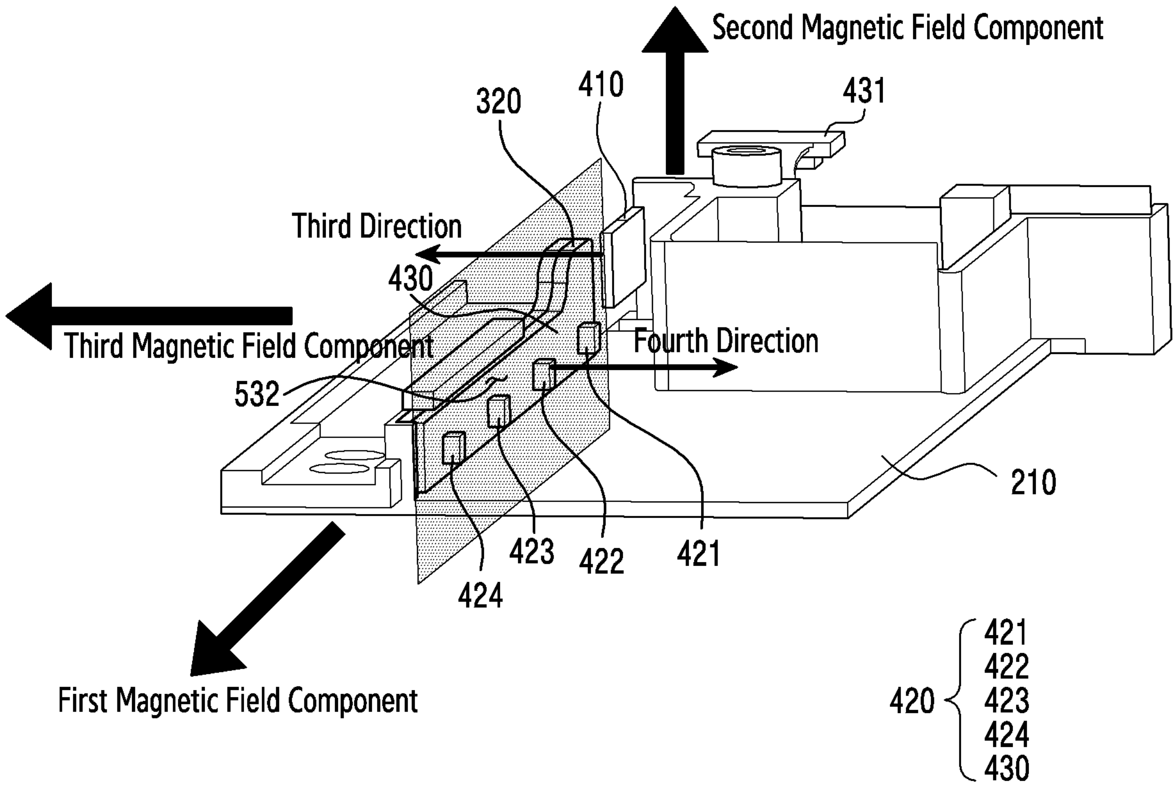
FIG. 10A is a partial front perspective view illustrating the interior of the electronic device according to various embodiments.

FIG. 10A is a front perspective view illustrating a portion of the interior of an electronic device according to various embodiments.

According to an embodiment, referring to FIG. 10A, the Hall sensor structure 420 and the at least one magnet 410 may be disposed inside the electronic device 100.

According to an embodiment, the at least one magnet 410 of FIG. 10A may be disposed such that the N pole is oriented in the first direction (e.g., the +x direction). However, the direction in which the N-pole is oriented is not limited thereto. For example, the at least one magnet 410 may be disposed such that the N pole thereof is oriented in the second direction (e.g., the −x direction) opposite to the first direction (e.g., the +x direction).

According to an embodiment, the Hall sensor structure 420 of FIG. 10A may be disposed in a direction opposite to the direction in which one surface of the at least one magnet 410 is oriented.

For example, the at least one magnet 410 may be disposed such that one surface (not illustrated) of the at least one magnet 410 is oriented in a third direction (e.g., the +y direction). In addition, according to an embodiment, the Hall sensor structure 420 may be disposed such that a second surface 532 of the sensor FPCB 430 of the Hall sensor structure 420 is oriented in a fourth direction (e.g., the −y direction) opposite to the third direction (e.g., the +y direction).

For example, the second surface 532 of the sensor FPCB 430 may be located on a first plane (e.g., the xz plane).

An embodiment related to the first magnetic field component, the second magnetic field component, and the third magnetic field component illustrated in FIGS. 10A and 10B will be described in greater detail below with reference to FIGS. 13 to 15.

Figure 10B:
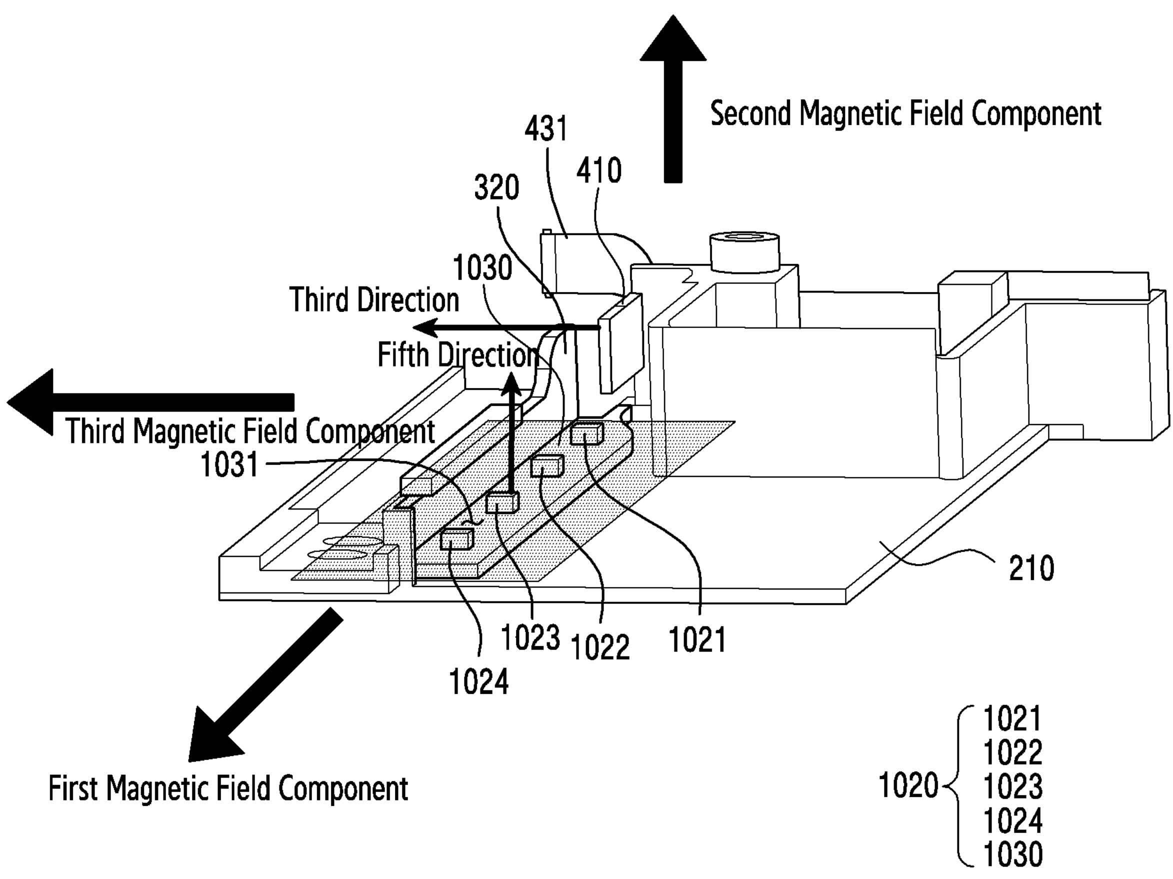
FIG. 10B is a partial front perspective view illustrating the interior of an electronic device according to various embodiments.

FIG. 10B is a front perspective view illustrating a portion of the interior of an electronic device according to various embodiments.

According to an embodiment, FIG. 10B is a view illustrating a Hall sensor structure 1020 (e.g., including Hall sensors 1021, 1022, 1023, 1024 and FPCB 1030) disposed to be oriented in a direction substantially different from the direction in which the Hall sensor structure 420 of FIG. 10A is oriented.

According to an embodiment, the at least one magnet 410 of FIG. 10B may be disposed at substantially the same position as the at least one magnet 410 of FIG. 10A.

According to an embodiment, the Hall sensor structure 1020 of FIG. 10B may be disposed such that a third surface 1031 of the sensor FPCB 1030 is oriented in a fifth direction (e.g., the −z direction) perpendicular to a fourth direction (e.g., the −y direction) in which the second surface 532 of the Hall sensor structure 420 of FIG. 10A is oriented.

For example, the third surface 1031 of the sensor FPCB 1030 of the Hall sensor structure 1020 may be provided on a second plane (e.g., the xy plane).

An example embodiment related to the difference between FIGS. 10A and 10B will be described in greater detail below with reference to FIG. 11.

Figure 11:
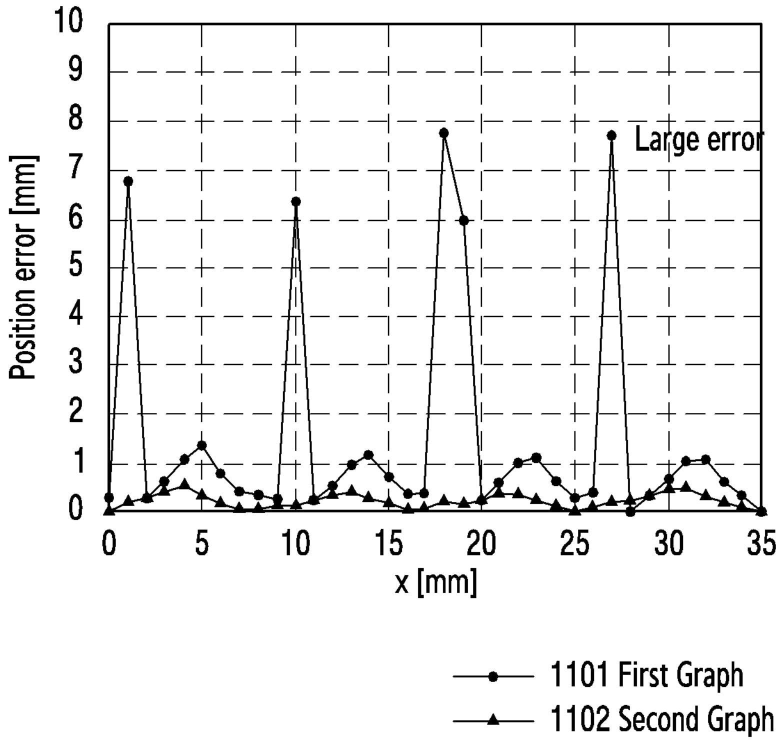
FIG. 11 a graph comparing noise levels measured by a Hall sensor structure and at least one magnet of an electronic device according to various embodiments.

FIG. 11 is a graph comparing noise levels measured by a Hall sensor structure and at least one magnet of an electronic device according to various embodiments.

For example, FIG. 11 shows graphs comparing noise levels measured with the arrangements of the Hall sensor structures of FIGS. 10A and FIG. 10B.

According to an embodiment, the first graph 1101 is a graph representing noise generated when the Hall sensor structure 1020 of FIG. 10B measures a magnetic field formed by the at least one magnet 410.

According to an embodiment, the first graph 1101 is a graph representing noise generated when the third surface (e.g., 1031) of the sensor FPCB 1030 of the Hall sensor structure 1020 of FIG. 10B is disposed to be oriented in the fifth direction (e.g., the −z direction) perpendicular to the third direction (e.g., the +y direction) in which the one surface (not illustrated) of the at least one magnet 410 is oriented. For example, the first graph 1101 is a graph representing noise measured when the sensor FPCB 1030 is disposed on the first plane (e.g., the xy plane).

According to an embodiment, the second graph 1102 is a graph representing noise generated when the Hall sensor structure 420 of FIG. 10A measures a magnetic field formed by the at least one magnet 410.

According to an embodiment, the second graph 1102 is a graph representing noise generated when the sensor FPCB 430 of the Hall sensor structure 420 of FIG. 10A is disposed to be oriented in the fourth direction (e.g., the −y direction) opposite to the third direction (e.g., the +y direction) in which the one surface (not illustrated) of the at least one magnet 410 is oriented. For example, the second graph 1102 is a graph representing noise measured when the sensor FPCB 430 is disposed on the second plane (e.g., the xz plane).

When comparing the first graph 1101 and the second graph 1102 according to an embodiment, when the Hall sensor structure 420 is disposed on the first plane (e.g., the xy plane), noise higher than that generated when the Hall sensor structure 420 is disposed on the second plane (e.g., the xz plane) may be measured.

Therefore, when the Hall sensor structure 420 is disposed on the first plane (e.g., the xz plane) inside the electronic device 100, the electronic device 100 may determine the changing size of the flexible display 120 more accurately than that in the case where the Hall sensor structure 420 is disposed on the second plane (e.g., the xy plane) inside the electronic device 100.

According to an embodiment, the processor of the electronic device 100 according to an embodiment is capable of more accurately determining the moving distance by which the second housing 112 slides with respect to the first housing 111 based on the magnetic field accurately sensed and acquired by the Hall sensor structure 420.

Figure 12:
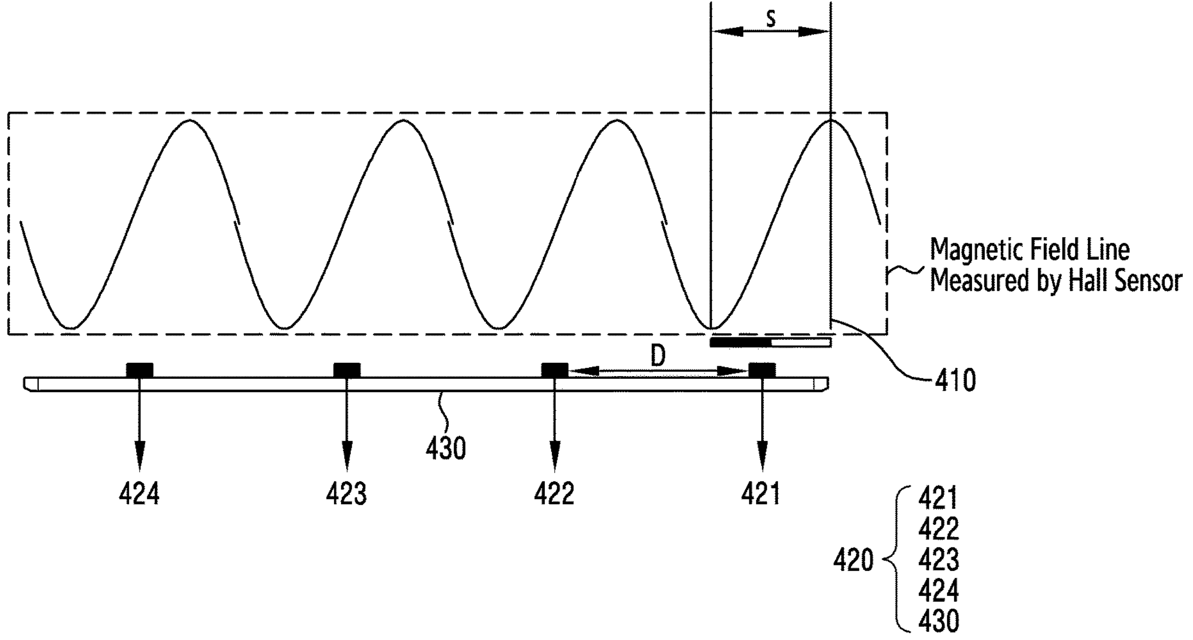
FIG. 12 is a diagram illustrating a Hall sensor structure and at least one magnet according to various embodiments.

FIG. 12 is a diagram illustrating a Hall sensor structure and at least one magnet according to various embodiments.

According to an embodiment, referring to FIG. 12, the Hall sensor structure 420 may sense a magnetic field formed by the at least one magnet 410.

According to an embodiment, the length S of the at least one magnet 410 according to an embodiment may be shorter than first distance D between the Hall sensors of the Hall sensor structure 420 and longer than ½ of the first distance D.

According to an embodiment, since the length S of the at least one magnet 410 is shorter than the first distance D, only one Hall sensor of the Hall sensor structure 420 may measure the strength of the magnetic field formed by the at least one magnet 410. For example, in the case where the length S of the at least one magnet 410 is shorter than the first distance D, when the at least one magnet 410 is located adjacent to the first Hall sensor 421, the second Hall sensor 422 is not capable of sensing the magnetic field formed by the at least one magnet 410.

In addition, according to an embodiment, since the length S of the at least one magnet 410 is longer than ½ of the first distance D, the Hall sensor structure 420 is capable of continuously sensing the strength of between the hall sensors. For example, the first Hall sensor 421 and the second Hall sensor 422 may also sense the strength of the magnetic field at a point between the first Hall sensor 421 and the second Hall sensor 422. For example, since the length S of the at least one magnet 410 is longer than ½ of the first distance D, an area in which no magnetic field is sensed may not occur between the first Hall sensor 421 and the second Hall sensor 422.

According to an embodiment, an embodiment related to the magnetic force measured by the at least one magnet 410 and the Hall sensor structure 420 via the at least one magnet 410 will be described in greater detail below with reference to FIGS. 13 to 16.

Figure 13:
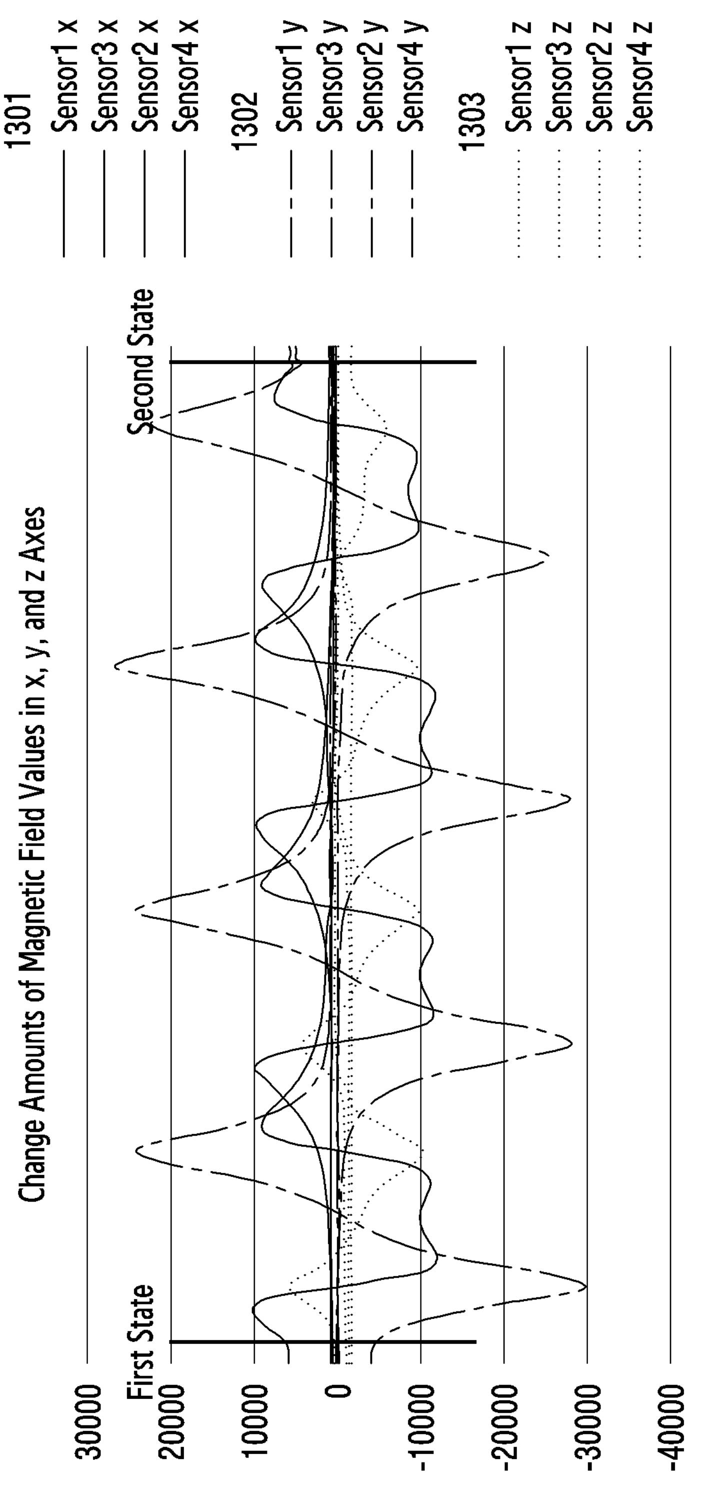
FIG. 13 is a graph comparing the strengths of magnetic fields measured by a Hall sensor structure according to various embodiments.

FIG. 13 is a graph comparing the strengths of magnetic fields measured by a Hall sensor structure according to various embodiments.

According to an embodiment, as described above, the Hall sensor structure 420 may sense a magnetic field formed by the at least one magnet 410.

Referring to FIGS. 10 and 13, according to an embodiment, a magnetic field may include a first magnetic field component, a second magnetic field component distinct from the first magnetic field component, and a third magnetic field component distinct from the first magnetic field component and the second magnetic field component.

According to an embodiment, the first magnetic field component may refer to a magnetic field formed in a first direction (e.g., the +x direction or the −x direction).

In addition, according to an embodiment, the second magnetic field component may refer to a magnetic field formed in the second direction (e.g., the +z direction or the −z direction) which is perpendicular to the first direction and in which the front surface (e.g., 101 in FIG. 1) the electronic device 100 is oriented.

According to an embodiment, the third magnetic field component may refer to a magnetic field formed in the third direction (e.g., the +y direction or the −y direction) perpendicular to the first direction and the second direction.

According to an embodiment, the graphs in FIG. 13 may show the strengths of magnetic fields sensed by the Hall sensor structure 420 depending on the displacement of the at least one magnet 410.

According to an embodiment, the x axis of the graph of FIG. 13 may represent the displacement of the at least one magnet 410. For example, when the value of the x axis is 1, it may represent the position of the at least one magnet 410 when the electronic device 100 is in the first state 100A. According to an embodiment, when the value of the x axis is 1, it may represent a state in which the electronic device 100 is maximally contracted and the at least one magnet 410 is disposed adjacent to the first Hall sensor 421.

According to an embodiment, when the value of the x axis is 999, it may represent the position of the at least one magnet 410 when the electronic device 100 is in the second state 100B. According to an embodiment, when the value of the x axis is 999, it may represent the state in which the electronic device 100 is maximally expanded and at least one magnet 410 is disposed adjacent to the fourth Hall sensor 424.

According to an embodiment, the first graph 1301 is a graph comparing the values of the first magnetic field component depending on the displacement of the at least one magnet 410.

According to an embodiment, the second graph 1302 is a graph comparing the values of the second magnetic field component depending on the displacement of the at least one magnet 410.

According to an embodiment, the third graph 1303 is a graph comparing the values of the third magnetic field component depending on the displacement of the at least one magnet 410.

According to an embodiment, example embodiments related to the first graph 1301 and the second graph 1302 will be described in greater detail below with reference to FIG. 14.

According to an embodiment, an example embodiment related to the third graph 1303 will be described in greater detail below with reference to FIG. 15.

Figure 14:
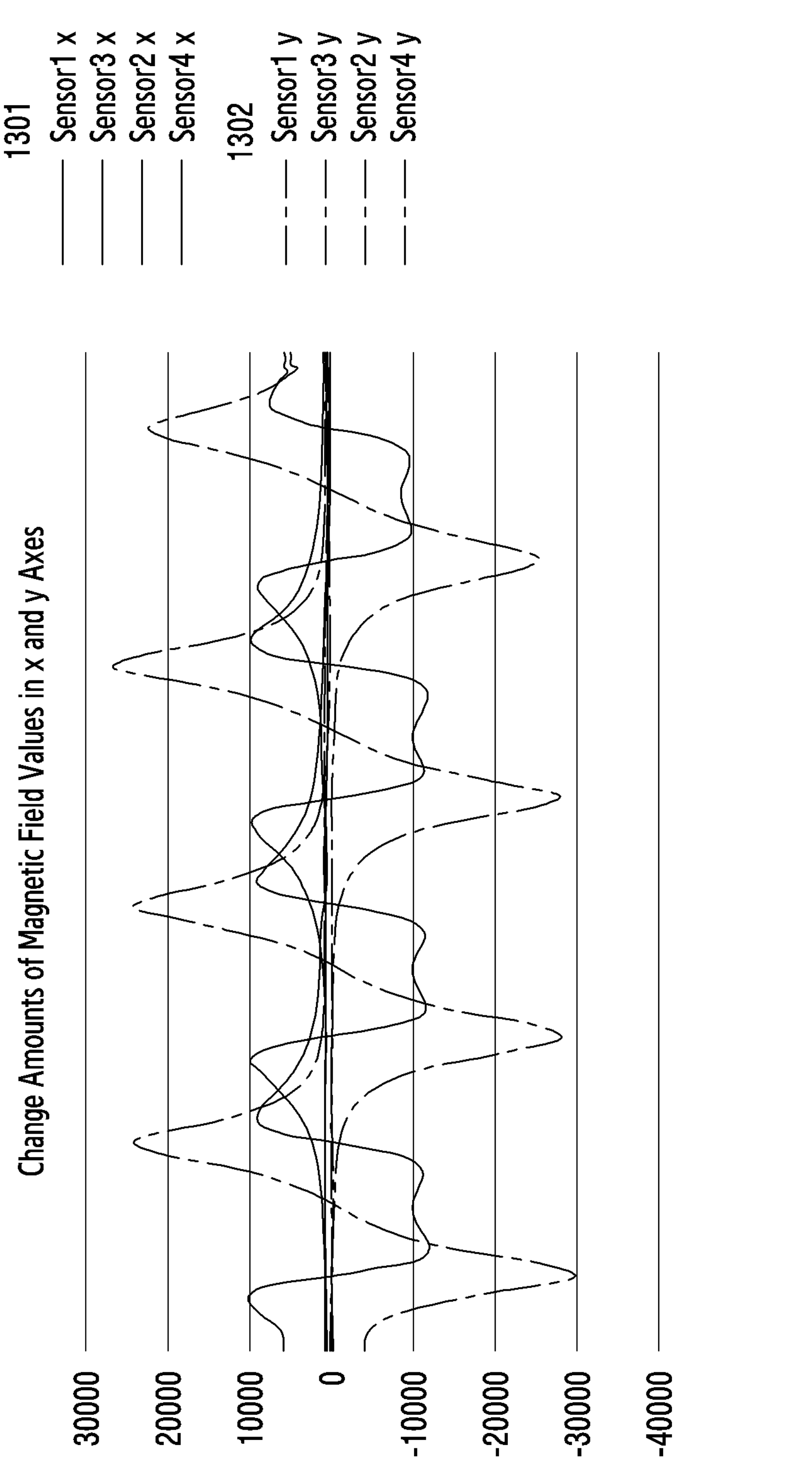
FIG. 14 is a graph comparing the strengths of magnetic fields measured by a Hall sensor structure according to various embodiments.

FIG. 14 is a graph comparing the strengths of magnetic fields measured by a Hall sensor structure according to various embodiments.

According to an embodiment, FIG. 14 shows the graphs of the first magnetic field component and the second magnetic field component among the graphs of FIG. 13. The graphs of FIG. 14 correspond to the first graph 1301 and the second graph 1302 of FIG. 13.

According to an embodiment, the graphs of FIG. 14 may represent changes in the strengths of the magnetic fields measured by the Hall sensor structure 420 depending a change in the position of the at least one magnet 410.

According to an embodiment, when the at least one magnet 410 is disposed adjacent to the Hall sensor structure 420, the strength of the magnetic field measured by the Hall sensor structure 420 may change.

For example, referring to the first graph 1301 and the second graph 1302, as the at least one magnet 410 moves in the first direction (e.g., the +x direction or the −x direction), the strength of the magnetic field measured by the Hall sensor structure 420 may change.

For example, as the at least one magnet 410 approaches the first Hall sensor 421, the strength of the second magnetic field component measured by the first Hall sensor 421 may decrease and then increase. According to an embodiment, when the at least one magnet 410 and the first Hall sensor 421 are disposed at the same position, the strength of the second magnetic field component may have a value of zero.

According to an embodiment, as the at least one magnet 410 approaches the second Hall sensor 422, the strength of the second magnetic field component measured by the first Hall sensor 421 may have a value of 0 and the strength of the magnetic field measured by the second Hall sensor 422 may decrease and then increase.

Referring to the graphs of FIG. 14, through the changes in the strength of the first magnetic field component and the strength of the second magnetic field component measured by one Hall sensor of the Hall sensor structures 420, the electronic device 100 may determine the position of the at least one magnet position. For example, through the changes in the strength of the first magnetic field component and the strength of the second magnetic field component sensed by the first Hall sensor 421, the electronic device 100 may determine that the at least one magnet 410 is disposed adjacent to the first Hall sensor 421.

According to an embodiment, through this, the at least one processor (not illustrated) may determine the moving distance by which the second housing 112 slides with respect to the first housing 111.

Figure 15:
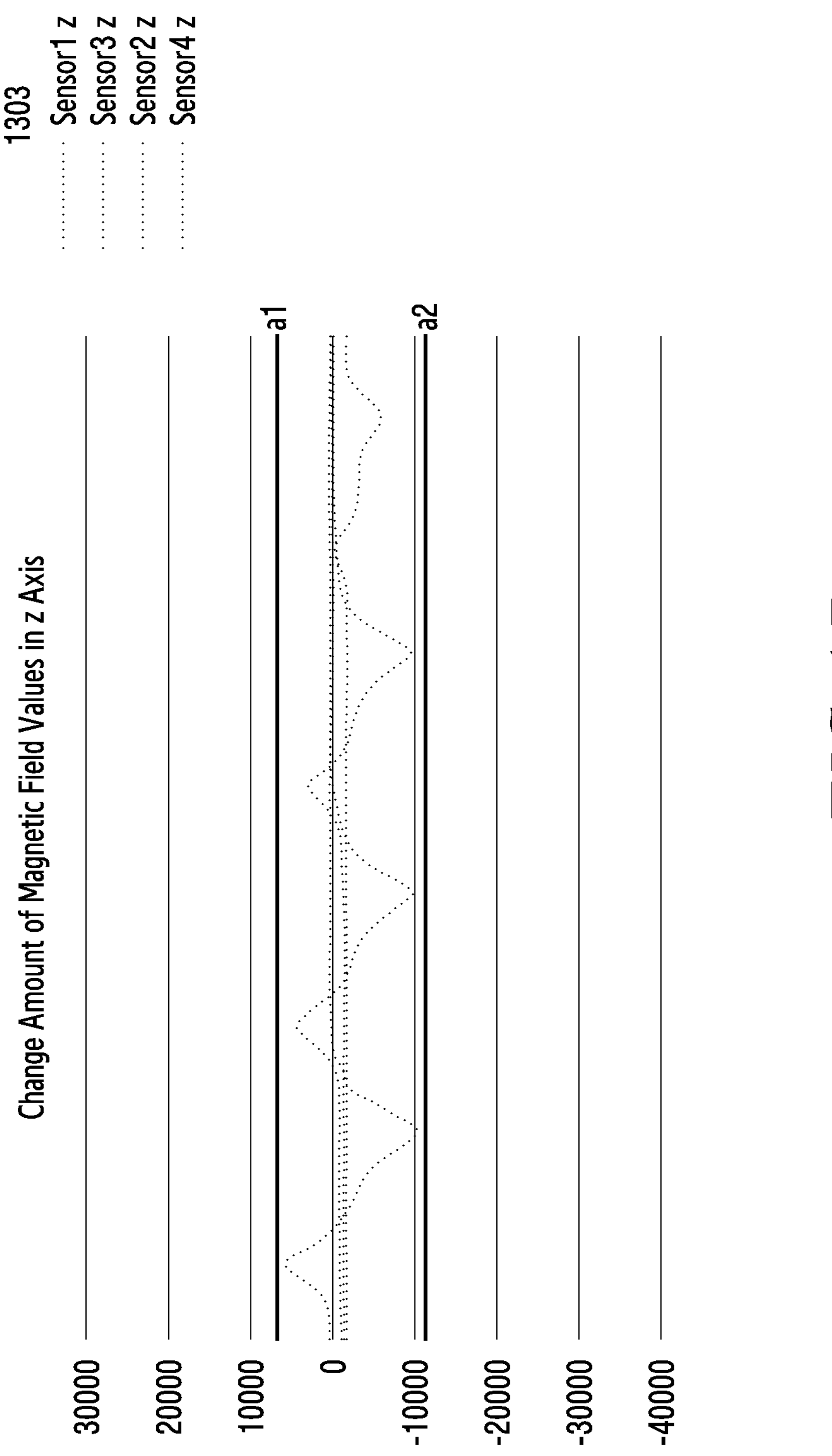
FIG. 15 is a graph comparing the strengths of third magnetic field component measured by a Hall sensor structure according to various embodiments.

FIG. 15 is a graph comparing the strengths of third magnetic field component measured by a plurality of Hall sensors according to various embodiments.

According to an embodiment, the at least one processor of the electronic device 100 may determine noise using the strength of the third magnetic field component.

For example, when a value of the third magnetic field component sensed by the Hall sensor structure 420 deviates from a predetermined value, the at least one processor may determine that the third magnetic field component sensed by the Hall sensor structure 420 is a magnetic component input by an external magnetic field. For example, the at least one processor according to an embodiment may determine the third magnetic field component sensed by the Hall sensor structure 420 as noise.

According to an embodiment, the third magnetic field component may have a first threshold value a1 and a second threshold value a2. According to an embodiment, the processor of the electronic device 100 may input only the values of the third magnetic field component between the first threshold value a1 and the second threshold value a2.

According to an embodiment, the absolute value of the first threshold value a1 may be substantially the same as the absolute value of the second threshold value a2. However, the absolute value of the first threshold value a1 is not limited thereto. For example, the absolute value of the first threshold value a1 may be greater than the absolute value of the second threshold value a2. As another example, the absolute value of the first threshold value a1 may be smaller than the absolute value of the second threshold value a2.

According to an embodiment, the processor of the electronic device 100 may not input the values of the third magnetic field component less than the first threshold value a1. According to an embodiment, the processor of the electronic device 100 may not input the values of the third magnetic field component less than the first threshold value a1.

According to an embodiment of the disclosure, the processor of the electronic device 100 may determine the moving distance by which the second housing 112 slides with respect to the first housing 111 based on the third magnetic field component having a value within the first threshold value a1 to the second threshold value a2.

According to an embodiment, the processor may determine the moving distance by which the second housing 112 slides with respect to the first housing 111 based on the magnetic field at which noise is blocked.

According to an embodiment, when the processor of the electronic device 100 uses the third magnetic field component, the electronic device 100 may more accurately determine the changing size of the flexible display 120.

Figure 16:
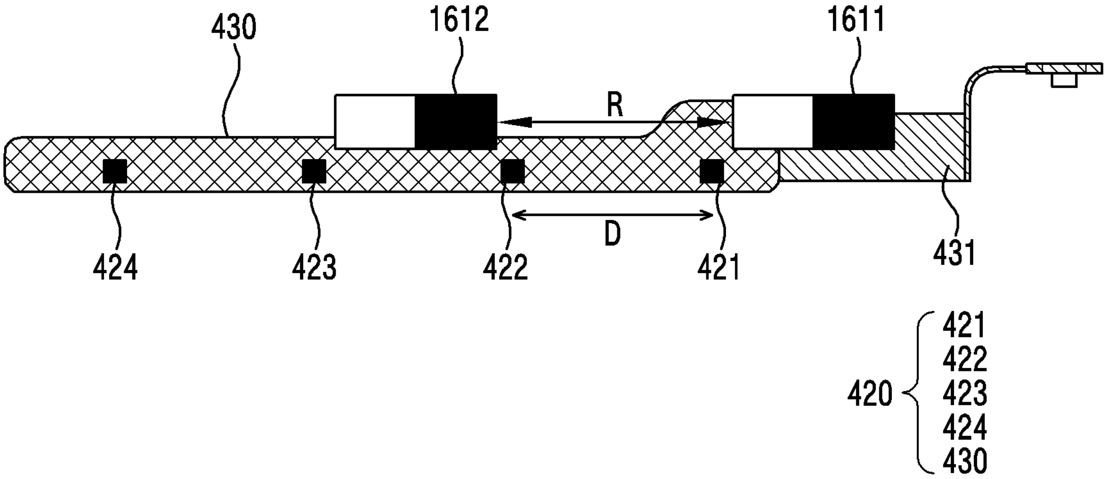
FIG. 16 is a diagram illustrating a Hall sensor structure and at least one magnet according to various embodiments.

FIG. 16 is a diagram illustrating a plurality of Hall sensors and at least one magnet according to various embodiments.

According to an embodiment, the at least one magnet 1610 may include a first magnet 1611 and a second magnet 1612 distinct from the first magnet 1611.

According to an embodiment, the N poles or the S poles of the first magnet 1611 and the second magnet 1612 may be aligned in the same direction.

For example, the N poles of the first magnet 1611 and the second magnet 1612 may be aligned in the first direction (e.g., the +x direction). According to another embodiment, the N poles of the first magnet 1611 and the second magnet 1612 may be aligned in the second direction (e.g., the −x direction).

According to an embodiment, respective Hall sensors of the Hall sensor structure 420 may be disposed to be spaced apart by a first distance D.

According to an embodiment, the first magnet 1611 may be disposed adjacent to the first Hall sensor 421 when the electronic device 100 is in the first state 100A. The first magnet may be disposed adjacent to one end of the connector 431 or the sensor FPCB 430 in the first state 100A.

According to an embodiment, the second magnet 1612 may be disposed to be spaced apart from the first magnet 1611 by a second distance R. According to an embodiment, the second distance R may be substantially equal to the first distance D between the first Hall sensor 421 and the second Hall sensor 422.

However, the second distance R is not limited thereto. For example, the second distance R may be smaller than the first distance D. As another example, the second distance R may be greater than the first distance D.

According to an embodiment, when the electronic device 100 is in the first state 100A, the second magnet 1612 may be disposed between the second Hall sensor 422 and the third Hall sensor 423.

According to an embodiment, the first magnet 1611 and the second magnet 1612 may be aligned in the first direction (e.g., the x direction or the −x direction) in which the second housing 112 slides with respect to the first housing 111.

According to an embodiment, since the at least one magnet 1610 includes the first magnet 1611 and the second magnet 1612, the Hall sensor structure 420 may sense the magnetic field component formed by the first magnet 1611 and the second magnet 1612.

Through this, the electronic device 100 may accurately determine the changing size of the flexible display 120.

Figure 17:
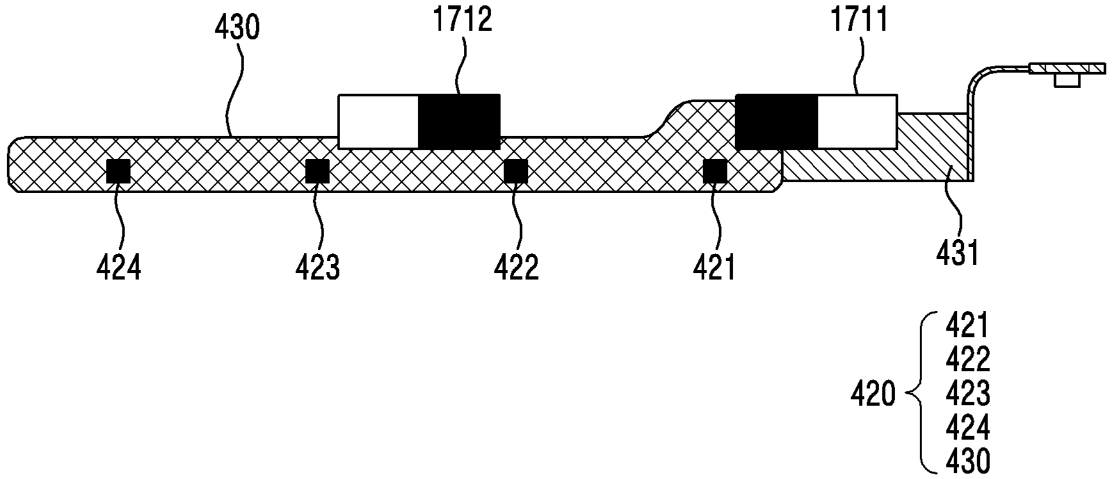
FIG. 17 is a diagram illustrating at least one magnet and a Hall sensor structure according to various embodiments.

FIG. 17 is a diagram illustrating at least one magnet and a Hall sensor structure according to various embodiments.

According to an embodiment, the at least one magnet 1710 may include a first magnet 1711 and a second magnet 1712 distinct from the first magnet 1711.

According to an embodiment, the N poles or the S poles of the first magnet 1711 and the second magnet 1712 may be aligned in opposite directions.

For example, the N pole of the first magnet 1711 may be oriented in the first direction (e.g., the +x direction), and the N pole of the second magnet 1712 may be directed in the second direction (e.g., the −x direction) opposite to the first direction. According to an embodiment, the N pole of the first magnet 1711 may be oriented in the second direction (e.g., the −x direction), and the second magnet 1712 may be aligned in the first direction (e.g., the +x direction).

According to an embodiment, since the N poles or the S poles of the first magnet 1711 and the second magnet 1712 are aligned in opposite directions, the magnitude of the magnetic field formed by the at least one magnet 1710 of the electronic device 100 may be increased.

According to an embodiment, since the magnitude of the magnetic field is increased, the Hall sensor structure 420 may sense the magnetic component more accurately compared to the case where the N poles or S poles of the first magnet 1711 and the second magnet 1712 are aligned in the same direction. Through this, the electronic device 100 may more accurately determine the changing size of the flexible display 120.

Figure 18:
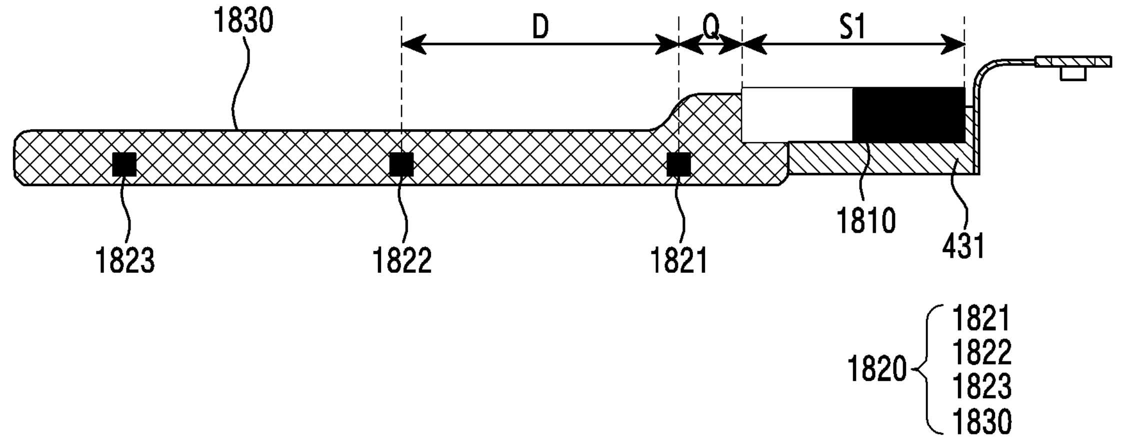
FIG. 18 is a diagram illustrating a Hall sensor structure and at least one magnet according to various embodiments

FIG. 18 is a diagram illustrating a Hall sensor structure and at least one magnet according to various embodiments.

According to an embodiment, the Hall sensor structure 1820 may include a first Hall sensor 1821, a second Hall sensor 1822 distinct from the first Hall sensor 1821, and a third Hall sensor 1823 distinct from the first Hall sensor 1821 and the second Hall sensor 1822. According to an embodiment, the Hall sensor structure 1820 may further include a sensor FPCB 1830.

According to an embodiment, the first Hall sensor 1821 may be disposed adjacent to the at least one magnet 1810 when the electronic device 100 is in the first state 100A.

According to an embodiment, the second Hall sensor 1822 may be disposed to be spaced apart from the first Hall sensor 1821 by a first distance D.

According to an embodiment, the third Hall sensor 1823 may be disposed to be spaced apart from the second Hall sensor 1822 by the first distance D. In an example, the third Hall sensor 1823 may be disposed adjacent to the at least one magnet 1810 when the electronic device 100 is in the second state 100B.

According to an embodiment, when the electronic device 100 is in the first state 100A, the first Hall sensor 1821 may be disposed to be spaced apart from the at least one magnet 1810 by a second distance Q in the first direction (e.g., the +x-direction or the −x-direction).

According to an embodiment, in the first state 100A, the first Hall sensor 1821 may be disposed adjacent to the at least one magnet 1810. According to an embodiment, the second distance Q may be less than ½ of the first distance D.

In addition, according to an embodiment, the length S1 of the at least one magnet 1810 of FIG. 18 may be greater than the length S of the at least one magnet 410 of FIG. 9.

According to an embodiment, since the number of Hall sensors of the Hall sensor 1820 is reduced, a material cost for manufacturing the electronic device 100 may be reduced.

Through this, it is possible to reduce the time and cost of manufacturing the electronic device 100.

According to an embodiment, since the second distance Q is less than ½ of the first distance D, the Hall sensor structure 1820 may more accurately sense the strength of the magnetic field. According to an embodiment, since the length S1 of the at least one magnet 1810 of FIG. 18 increases compared to the length S of the at least one magnet 410 of FIG. 9, the Hall sensor structure 1820 may sense the strength of the magnetic field accurately.

Through this, the electronic device 100 according to an embodiment may accurately determine the changing size of the flexible display 120.

Figure 19:
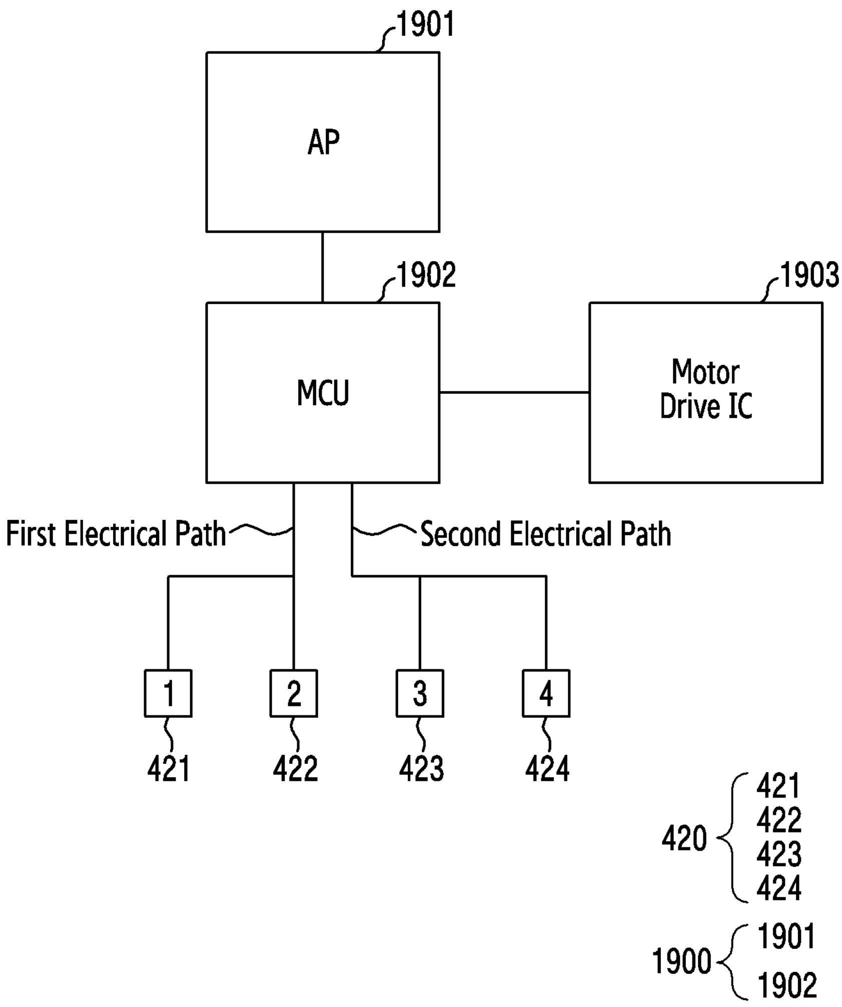
FIG. 19 is block diagram illustrating a processor of an electronic device according to various embodiments.

FIG. 19 is a block diagram illustrating a processor of an electronic device according to various embodiments.

According to an embodiment, the electronic device 100 may include at least one processor (e.g., including processing circuitry) 1900.

According to an embodiment, the at least one processor 1900 of the electronic device 100 may include a micro controller unit (MCU) (e.g., including a micro controller) 1902 and an application process (AP) (e.g., including processing circuitry) 1901 electrically connected to the MCU.

According to an embodiment, the MCU 1902 may be electrically connected to the Hall sensor structure 420. According to an embodiment, the MCU 1902 may be electrically connected to a motor drive IC (e.g., including a motor sensor) 1903 disposed inside the electronic device 100.

According to an embodiment, the MCU 1902 may determine the moving distance by which the second housing 112 slides with respect to the first housing 111 based on the magnetic field acquired via the Hall sensor structure 420 and the motor drive IC 1903. For example, the MCU 1902 may determine the size of the second housing (e.g., 112 in FIG. 1) exposed to the exterior by the motor drive IC 1903 and the Hall sensor structure 420.

According to an embodiment, the first Hall sensor 421 and the second Hall sensor 422 may share a first electrical path. According to an embodiment, the first Hall sensor 421 and the second Hall sensor 422 may be electrically connected to the MCU 1902 via the first electrical path.

According to an embodiment, the third Hall sensor 423 and the fourth Hall sensor 424 may share a second electrical path. According to an embodiment, the third Hall sensor 423 and the fourth Hall sensor 424 may be electrically connected to the MCU 1902 via the second electrical path.

According to an embodiment, since the first electrical path and the second electrical path are shared, the MCU 1902 may receive magnetic field information based on the minimized/reduced electrical path.

According to an embodiment, the MCU 1902 may determine the moving distance by which the second housing 112 slides with respect to the first housing 111 using the received magnetic field information and the motor drive IC 1903.

According to an embodiment, the AP 1901 may display an application execution screen in an area of the flexible display 120 exposed to the exterior of the flexible display 120 based on the moving distance determined by the MCU 1902. For example, the MCU 1902 may transmit information on determining the moving distance of the second housing 112 to the AP 1901.

According to an embodiment, the AP 1901 may display the application execution screen acquired via the MCU 1902 in a first area 121 and/or a second area of the flexible display 120 exposed to the exterior based on the information.

According to an embodiment, since the information determined by the MCU 1902 and the information determined by the AP 1901 are different, the processor 1900 of the electronic device 100 may efficiently process the information.

Figure 20:
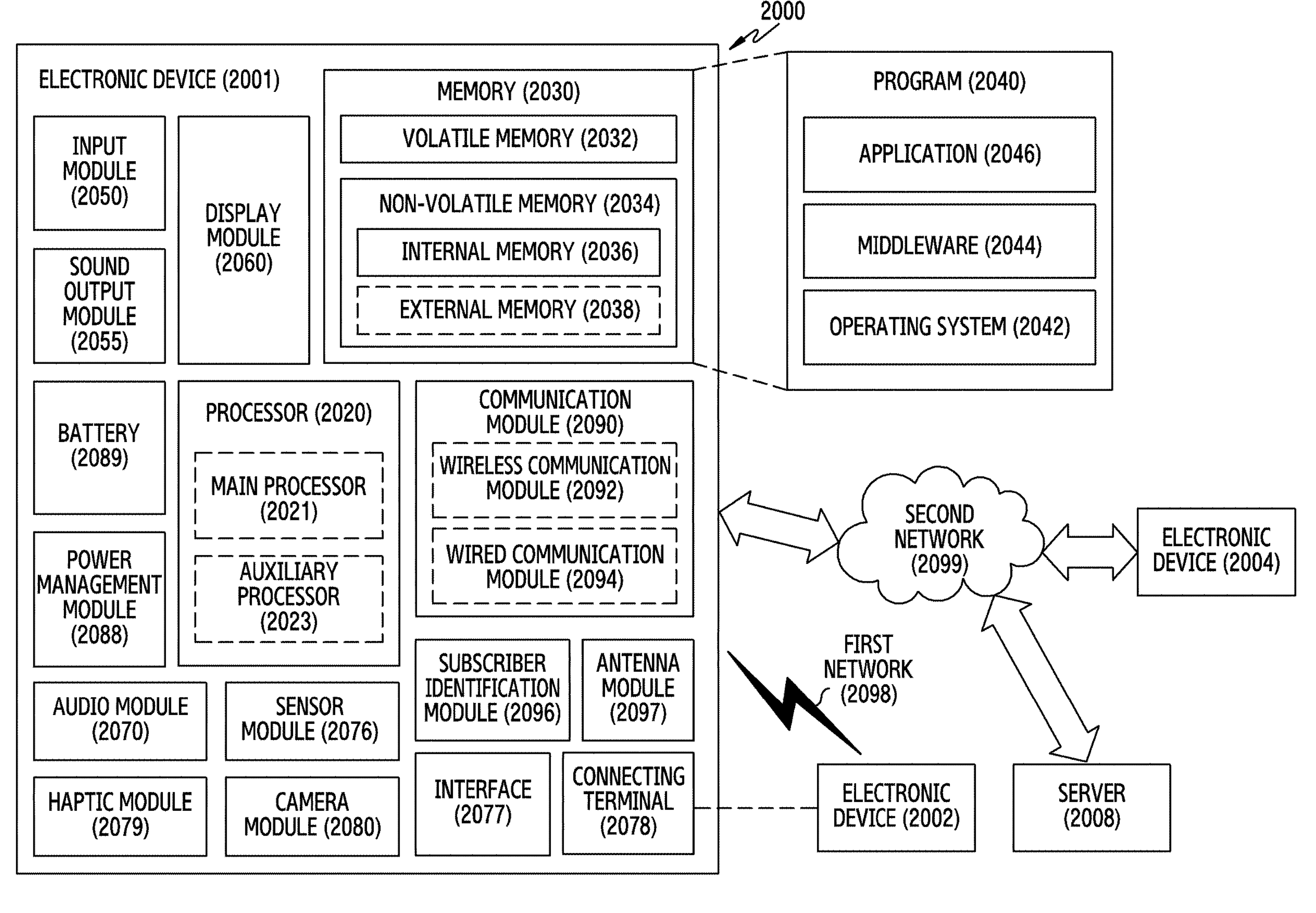
FIG. 20 is a block diagram illustrating an example electronic device in a network environment according to various embodiments.

FIG. 20 is a block diagram illustrating an example electronic device 2001 in a network environment 2000 according to various embodiments. Referring to FIG. 20, the electronic device 2001 in the network environment 2000 may communicate with an electronic device 2002 via a first network 2098 (e.g., a short-range wireless communication network), or at least one of an electronic device 2004 or a server 2008 via a second network 2099 (e.g., a long-range wireless communication network). According to an embodiment, the electronic device 2001 may communicate with the electronic device 2004 via the server 2008. According to an embodiment, the electronic device 2001 may include a processor 2020, memory 2030, an input module 2050, a sound output module 2055, a display module 2060, an audio module 2070, a sensor module 2076, an interface 2077, a connecting terminal 2078, a haptic module 2079, a camera module 2080, a power management module 2088, a battery 2089, a communication module 2090, a subscriber identification module (SIM) 2096, or an antenna module 2097. In various embodiments, at least one of the components (e.g., the connecting terminal 2078) may be omitted from the electronic device 2001, or one or more other components may be added in the electronic device 2001. In various embodiments, some of the components (e.g., the sensor module 2076, the camera module 2080, or the antenna module 2097) may be implemented as a single component (e.g., the display module 2060).

The processor 2020 may execute, for example, software (e.g., a program 2040) to control at least one other component (e.g., a hardware or software component) of the electronic device 2001 coupled with the processor 2020, and may perform various data processing or computation. According to an embodiment, as at least part of the data processing or computation, the processor 2020 may store a command or data received from another component (e.g., the sensor module 2076 or the communication module 2090) in volatile memory 2032, process the command or the data stored in the volatile memory 2032, and store resulting data in non-volatile memory 2034. According to an embodiment, the processor 2020 may include a main processor 2021 (e.g., a central processing unit (CPU) or an application processor (AP)), or an auxiliary processor 2023 (e.g., a graphics processing unit (GPU), a neural processing unit (NPU), an image signal processor (ISP), a sensor hub processor, or a communication processor (CP)) that is operable independently from, or in conjunction with, the main processor 2021. For example, when the electronic device 2001 includes the main processor 2021 and the auxiliary processor 2023, the auxiliary processor 2023 may be adapted to consume less power than the main processor 2021, or to be specific to a specified function. The auxiliary processor 2023 may be implemented as separate from, or as part of the main processor 2021.

The auxiliary processor 2023 may control at least some of functions or states related to at least one component (e.g., the display module 2060, the sensor module 2076, or the communication module 2090) among the components of the electronic device 2001, instead of the main processor 2021 while the main processor 2021 is in an inactive (e.g., sleep) state, or together with the main processor 2021 while the main processor 2021 is in an active state (e.g., executing an application). According to an embodiment, the auxiliary processor 2023 (e.g., an image signal processor or a communication processor) may be implemented as part of another component (e.g., the camera module 2080 or the communication module 2090) functionally related to the auxiliary processor 2023. According to an embodiment, the auxiliary processor 2023 (e.g., the neural processing unit) may include a hardware structure specified for artificial intelligence model processing. An artificial intelligence model may be generated by machine learning. Such learning may be performed, e.g., by the electronic device 2001 where the artificial intelligence is performed or via a separate server (e.g., the server 2008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 2030 may store various data used by at least one component (e.g., the processor 2020 or the sensor module 2076) of the electronic device 2001. The various data may include, for example, software (e.g., the program 2040) and input data or output data for a command related thereto. The memory 2030 may include the volatile memory 2032 or the non-volatile memory 2034.

The program 2040 may be stored in the memory 2030 as software, and may include, for example, an operating system (OS) 2042, middleware 2044, or an application 2046.

The input module 2050 may receive a command or data to be used by another component (e.g., the processor 2020) of the electronic device 2001, from the outside (e.g., a user) of the electronic device 2001. The input module 2050 may include, for example, a microphone, a mouse, a keyboard, a key (e.g., a button), or a digital pen (e.g., a stylus pen).

The sound output module 2055 may output sound signals to the outside of the electronic device 2001. The sound output module 2055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 2060 may visually provide information to the outside (e.g., a user) of the electronic device 2001. The display module 2060 may include, for example, a display, a hologram device, or a projector and control circuitry to control a corresponding one of the display, hologram device, and projector. According to an embodiment, the display module 2060 may include a touch sensor adapted to detect a touch, or a pressure sensor adapted to measure the intensity of force incurred by the touch.

The audio module 2070 may convert a sound into an electrical signal and vice versa. According to an embodiment, the audio module 2070 may obtain the sound via the input module 2050, or output the sound via the sound output module 2055 or a headphone of an external electronic device (e.g., an electronic device 2002) directly (e.g., wiredly) or wirelessly coupled with the electronic device 2001.

The sensor module 2076 may detect an operational state (e.g., power or temperature) of the electronic device 2001 or an environmental state (e.g., a state of a user) external to the electronic device 2001, and then generate an electrical signal or data value corresponding to the detected state. According to an embodiment, the sensor module 2076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2077 may support one or more specified protocols to be used for the electronic device 2001 to be coupled with the external electronic device (e.g., the electronic device 2002) directly (e.g., wiredly) or wirelessly. According to an embodiment, the interface 2077 may include, for example, a high definition multimedia interface (HDMI), a universal serial bus (USB) interface, a secure digital (SD) card interface, or an audio interface.

A connecting terminal 2078 may include a connector via which the electronic device 2001 may be physically connected with the external electronic device (e.g., the electronic device 2002). According to an embodiment, the connecting terminal 2078 may include, for example, a HDMI connector, a USB connector, a SD card connector, or an audio connector (e.g., a headphone connector).

The haptic module 2079 may convert an electrical signal into a mechanical stimulus (e.g., a vibration or a movement) or electrical stimulus which may be recognized by a user via his tactile sensation or kinesthetic sensation. According to an embodiment, the haptic module 2079 may include, for example, a motor, a piezoelectric element, or an electric stimulator.

The camera module 2080 may capture a still image or moving images. According to an embodiment, the camera module 2080 may include one or more lenses, image sensors, image signal processors, or flashes.

The power management module 2088 may manage power supplied to the electronic device 2001. According to an embodiment, the power management module 2088 may be implemented as at least part of, for example, a power management integrated circuit (PMIC).

The battery 2089 may supply power to at least one component of the electronic device 2001. According to an embodiment, the battery 2089 may include, for example, a primary cell which is not rechargeable, a secondary cell which is rechargeable, or a fuel cell.

The communication module 2090 may support establishing a direct (e.g., wired) communication channel or a wireless communication channel between the electronic device 2001 and the external electronic device (e.g., the electronic device 2002, the electronic device 2004, or the server 2008) and performing communication via the established communication channel. The communication module 2090 may include one or more communication processors that are operable independently from the processor 2020 (e.g., the application processor (AP)) and supports a direct (e.g., wired) communication or a wireless communication. According to an embodiment, the communication module 2090 may include a wireless communication module 2092 (e.g., a cellular communication module, a short-range wireless communication module, or a global navigation satellite system (GNSS) communication module) or a wired communication module 2094 (e.g., a local area network (LAN) communication module or a power line communication (PLC) module). A corresponding one of these communication modules may communicate with the external electronic device via the first network 2098 (e.g., a short-range communication network, such as Bluetooth™ wireless-fidelity (Wi-Fi) direct, or infrared data association (IrDA)) or the second network 2099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2092 may identify and authenticate the electronic device 2001 in a communication network, such as the first network 2098 or the second network 2099, using subscriber information (e.g., international mobile subscriber identity (IMSI)) stored in the subscriber identification module 2096.

The wireless communication module 2092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 2092 may support a high-frequency band (e.g., the mmWave band) to achieve, e.g., a high data transmission rate. The wireless communication module 2092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 2092 may support various requirements specified in the electronic device 2001, an external electronic device (e.g., the electronic device 2004), or a network system (e.g., the second network 2099). According to an embodiment, the wireless communication module 2092 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 2097 may transmit or receive a signal or power to or from the outside (e.g., the external electronic device) of the electronic device 2001. According to an embodiment, the antenna module 2097 may include an antenna including a radiating element including a conductive material or a conductive pattern formed in or on a substrate (e.g., a printed circuit board (PCB)). According to an embodiment, the antenna module 2097 may include a plurality of antennas (e.g., array antennas). In such a case, at least one antenna appropriate for a communication scheme used in the communication network, such as the first network 2098 or the second network 2099, may be selected, for example, by the communication module 2090 (e.g., the wireless communication module 2092) from the plurality of antennas. The signal or the power may then be transmitted or received between the communication module 2090 and the external electronic device via the selected at least one antenna. According to an embodiment, another component (e.g., a radio frequency integrated circuit (RFIC)) other than the radiating element may be additionally formed as part of the antenna module 2097.

According to various embodiments, the antenna module 2097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2001 and the external electronic device 2004 via the server 2008 coupled with the second network 2099. Each of the electronic devices 2002 or 2004 may be a device of a same type as, or a different type, from the electronic device 2001. According to an embodiment, all or some of operations to be executed at the electronic device 2001 may be executed at one or more of the external electronic devices 2002, 2004, or 2008. For example, if the electronic device 2001 should perform a function or a service automatically, or in response to a request from a user or another device, the electronic device 2001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2001. The electronic device 2001 may provide the outcome, with or without further processing of the outcome, as at least part of a reply to the request. To that end, a cloud computing, distributed computing, mobile edge computing (MEC), or client-server computing technology may be used, for example. The electronic device 2001 may provide ultra low-latency services using, e.g., distributed computing or mobile edge computing. In an embodiment, the external electronic device 2004 may include an internet-of-things (IoT) device. The server 2008 may be an intelligent server using machine learning and/or a neural network. According to an embodiment, the external electronic device 2004 or the server 2008 may be included in the second network 2099. The electronic device 2001 may be applied to intelligent services (e.g., smart home, smart city, smart car, or healthcare) based on 5G communication technology or IoT-related technology.

An electronic device according to various example embodiments may include: a housing including a first housing and a second housing slidably connected to the first housing; a flexible display including a first area and a second area extending from the first area and configured to be drawn into or out of the housing as the second housing slides; a support plate disposed inside the electronic device and coupled to the second housing and configured to slide, wherein the support plate includes at least one magnet disposed in an area of the support plate wherein an N-pole and an S-pole are aligned in a first direction (e.g., the x direction) in which the second housing slides; a Hall sensor structure including at least one Hall sensor disposed inside the first housing adjacent to the at least one magnet and configured to measure a magnetic field of the at least one magnet, wherein Hall sensors of the Hall sensor structure are disposed along the first direction (e.g., +x direction) while respective Hall sensors of the Hall sensor structure are spaced apart from each other by a first distance; and at least one processor electrically connected to the Hall sensor structure, wherein the processor is configured to: determine a moving distance by which the second housing slides with respect to the first housing based on the magnetic field acquired by the Hall sensor structure via the at least one magnet.

According to an example embodiment, the support plate may further include a first guide configured to guide the second housing to slide in the first direction with respect to the first housing, and the at least one magnet may be disposed in an area of the support plate adjacent to the first guide.

According to an example embodiment, the Hall sensor structure may be spaced apart from the at least one magnet within a second distance.

According to an example embodiment, the second distance may in a range of 0.2 mm to 1.0 mm.

According to an example embodiment, the electronic device may include one of a first state in which the second housing is drawn into the housing and a second state in which the second housing is drawn out of the housing, and the Hall sensor structure may include a first Hall sensor disposed adjacent to the at least one magnet based on the electronic device being in the first state, a second Hall sensor disposed to be spaced apart from the first Hall sensor by the first distance, and a third Hall sensor disposed to be spaced apart from the second Hall sensor by the first distance and disposed adjacent to the at least one magnet based on the electronic device being in the second state.

According to an example embodiment, the at least one magnet may be disposed to be spaced apart from the first Hall sensor by a second distance in the first direction in the first state, and the second distance may be less than half of the first distance.

According to an example embodiment, the at least one magnet may include a first magnet and a second magnet spaced apart from the first magnet by a third distance, and the first magnet and the second magnet may be aligned in a row in the first direction.

According to an example embodiment, N poles or S poles of the first magnet and the second magnet may be aligned in mutually opposite directions.

According to an example embodiment, the processor may include a micro controller unit (MCU) including a micro controller electrically connected to the Hall sensor structure and a motor disposed in the electronic device, and an application processor (AP) electrically connected to the MCU, and the MCU may be configured to: determine the moving distance by which the second housing slides with respect to the first housing based on the magnetic field acquired via the Hall sensor structure and the motor.

According to an example embodiment, the AP may be configured to: display an execution screen of an application in an area of the flexible display visible to exterior based on the moving distance determined by the MCU.

According to an example embodiment, the Hall sensor structure may include a first Hall sensor, a second Hall sensor, a third Hall sensor, and a fourth Hall sensor, the first Hall sensor and the second Hall sensor may be electrically connected to the MCU by a first electrical path, and the third Hall sensor and the fourth Hall sensor may be electrically connected to the MCU by a second electrical path.

According to an example embodiment, a second guide disposed in the first housing and protruding toward a rear surface of the electronic device may be further included, wherein the Hall sensor structure and a flexible printed circuit board (FPCB) electrically connected to the Hall sensor structure may be fixed to the second guide.

According to an example embodiment, multiple bars attached to a rear surface of the second area of the flexible display to support the second area may be further included, wherein the rear surface of the second area is not visible to exterior.

According to an example embodiment, the magnetic field may include a first magnetic field component formed in the first direction, a second magnetic field component formed in a second direction perpendicular to the first direction toward a front surface or a rear surface of the electronic device, and a third magnetic field component formed in a third direction perpendicular to the first direction and the second direction, and the processor may be configured to: determine the moving distance by which the second housing slides with respect to the first housing based on the first magnetic field component and the second magnetic field component acquired through the at least one magnet.

According to an example embodiment, the processor may be configured to: further determine the moving distance by which the second housing slides with respect to the first housing based on the third magnetic field component having a value within a first threshold value to a second threshold value.

According to an example embodiment, the Hall sensor structure and the at least one magnet may be disposed to be perpendicular to the first area of the flexible display. According to various example embodiments, an electronic device may include: a housing including a first housing and a second housing slidably connected to the first housing; a flexible display including a first area and a second area extending from the first area and configured to be drawn into or out of the housing as the second housing slides; a support plate disposed inside the electronic device and coupled to the second housing to slide, wherein the support plate includes at least one magnet disposed in an area of the support plate such that an N-pole and an S-pole are aligned in a first direction in which the second housing slides; a Hall sensor structure including at least one Hall sensor disposed inside the first housing adjacent to the at least one magnet and configured to measure a magnetic field of the at least one magnet, wherein Hall sensors of the Hall sensor structure are disposed along the first direction while the Hall sensors are spaced apart from each other by a first distance; and at least one processor electrically connected to the Hall sensor structure, wherein the at least one magnet may have a length shorter than the first distance between the Hall sensors, and is longer than half of the first distance, and wherein the processor may be configured to: determine a moving distance by which the second housing slides with respect to the first housing based on the magnetic field acquired by the Hall sensor structure via the at least one magnet.

According to an example embodiment, the electronic device may include one of a first state in which the second housing is drawn into the housing and a second state in which the second housing is drawn out of the housing, and the Hall sensor structure may include a first Hall sensor disposed adjacent to the at least one magnet based on the electronic device being in the first state, a second Hall sensor spaced apart from the first Hall sensor by the first distance, and a third Hall sensor spaced apart from the second Hall sensor by the first distance and disposed adjacent to the at least one magnet based on the electronic device being in the second state.

According to an example embodiment, the at least one magnet may be spaced apart from the first Hall sensor by a second distance in the first direction in the first state, and the second distance may be less than half of the first distance.

According to an example embodiment, the at least one magnet may include a first magnet and a second magnet spaced apart from the first magnet by a third distance, and the first magnet and the second magnet may be aligned in a row in the first direction.

According to an example embodiment, N poles or S poles of the first magnet and the second magnet may be aligned in mutually opposite directions.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2040) including one or more instructions that are stored in a storage medium (e.g., internal memory 2036 or external memory 2038) that is readable by a machine (e.g., the electronic device 2001). For example, a processor (e.g., the processor 2020) of the machine (e.g., the electronic device 2001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a housing including a first housing and a second housing slidably connected to the first housing, wherein the second housing slides in a first direction with respect to the first housing;

a flexible display including a first area and a second area extending from the first area, wherein the second area of the flexible display is drawn into or drawn out of the housing according to the movement of the second housing;

a support plate coupled to the second housing and configured to slide with the second housing, wherein the support plate includes at least one magnet disposed at a lateral side of the support plate;

a Hall sensor structure including at least one Hall sensor and a sensor flexible printed circuit board (FPCB), wherein the at least one Hall sensor is disposed on the sensor FPCB and configured to detect a magnetic field of the at least one magnet on the support plate coupled to the second housing, a guide member configured to protrude toward a rear side of the electronic device, wherein a lateral side of a protruded portion of the guide member faces the lateral side of the support plate at which the magnet is disposed, and wherein the at least one Hall sensor is disposed at the lateral side of the protruded portion of the guide member through the sensor FPCB and faces the lateral side of the support plate, memory storing instructions;

a printed circuit board (PCB) disposed in the first housing; and at least one processor disposed on the PCB and electrically connected to the Hall sensor structure, wherein the instructions, when being executed by the at least one processor individually or collectively, cause the electronic device to:

receive, through the PCB and the FPCB, a signal detected by the at least one Hall sensor indicative of a relative position of the second housing with respect to the first housing, and identify a moving distance which the second housing slides with respect to the first housing based on the detection of the magnetic field obtained by the at least one Hall sensor.

2. The electronic device of claim 1, wherein the lateral side of the support plate, where the at least one magnet is disposed, is substantially perpendicular to a rear side of the electronic device.

3. The electronic device of claim 1, wherein the at least one Hall sensor of the Hall sensor structure is spaced apart from the at least one magnet within a second distance, and the second distance is in a range of 0.2 mm to 1.0 mm.

4. The electronic device of claim 1, wherein the Hall sensor structure comprises Hall sensors comprising the at least one Hall sensor, the Hall sensors are disposed along the first direction while respective Hall sensors of the Hall sensor structure are spaced apart from each other by a first distance, the electronic device includes one of a first state in which the second housing is drawn into the housing and a second state in which the second housing is drawn out of the housing, and the Hall sensor structure includes a first Hall sensor disposed adjacent to the at least one magnet based on the electronic device being in the first state, a second Hall sensor spaced apart from the first Hall sensor by the first distance, and a third Hall sensor spaced apart from the second Hall sensor by the first distance and disposed adjacent to the at least one magnet based on the electronic device being in the second state.

5. The electronic device of claim 4, wherein the at least one magnet is spaced apart from the first Hall sensor by a second distance in the first direction in the first state, and the second distance is less than half of the first distance.

6. The electronic device of claim 1, wherein the at least one magnet includes a first magnet and a second magnet spaced apart from the first magnet by a third distance, and the first magnet and the second magnet are aligned in a row in the first direction.

7. The electronic device of claim 6, wherein N poles or S poles of the first magnet and the second magnet are aligned in mutually opposite directions.

8. The electronic device of claim 1, wherein the processor includes a micro controller unit (MCU) comprising a micro controller electrically connected to the Hall sensor structure and a motor disposed in the electronic device, and an application processor (AP) electrically connected to the MCU, and the MCU is configured to: determine the moving distance by which the second housing slides with respect to the first housing based on the magnetic field acquired via the Hall sensor structure and the motor.

9. The electronic device of claim 8, wherein the AP is configured to:

display an execution screen of an application in an area of the flexible display visible to exterior based on the moving distance determined by the MCU.

10. The electronic device of claim 8, wherein the Hall sensor structure includes a first Hall sensor, a second Hall sensor, a third Hall sensor, and a fourth Hall sensor, the first Hall sensor and the second Hall sensor are electrically connected to the MCU by a first electrical path, and the third Hall sensor and the fourth Hall sensor are electrically connected to the MCU by a second electrical path.

11. The electronic device of claim 1, wherein the Hall sensor structure and the sensor FPCB electrically connected to the Hall sensor structure are fixed to the lateral side of the protruded portion of the guide member.

12. The electronic device of claim 1, further comprising:

multiple bars attached to a rear surface of the second area of the flexible display configured to support the second area, wherein the rear surface of the second area is not visible to an exterior of the electronic device, and wherein the support plate is connected to at least some of the multiple bars to move the multiple bars on a path as movement of the support plate.

13. The electronic device of claim 1, wherein an N-pole and an S-pole of the at least one magnet are aligned in the first direction in which the second housing slides, the Hall sensor structure comprises Hall sensors comprising the at least one Hall sensor, the Hall sensors are disposed along the first direction while respective Hall sensors of the Hall sensor structure are spaced apart from each other by a first distance, the magnetic field includes a first magnetic field component formed in the first direction, a second magnetic field component formed in a second direction perpendicular to the first direction toward a front surface or a rear surface of the electronic device, and a third magnetic field component formed in a third direction perpendicular to the first direction and the second direction, and the processor is configured to: determine the moving distance by which the second housing slides with respect to the first housing based on the first magnetic field component and the second magnetic field component acquired through the at least one magnet.

14. The electronic device of claim 13, wherein the processor is further configured to: determine the moving distance by which the second housing slides with respect to the first housing based on the third magnetic field component having a value within a first threshold value to a second threshold value.

15. The electronic device of claim 1, wherein the Hall sensor structure and the at least one magnet are perpendicular to the first area of the flexible display.

16. An electronic device comprising:

a housing including a first housing and a second housing slidably connected to the first housing, wherein the second housing slides with respect to the first housing;

a flexible display including a first area and a second area extending from the first area, wherein the second area of the flexible display is configured to be drawn into or drawn out of the housing according to the movement of the second housing;

a support plate coupled to the second housing to slide with the second housing, wherein the support plate includes at least one magnet disposed at a lateral side of the support plate such that an N-pole and an S-pole are aligned in a first direction in which the second housing slides;

a Hall sensor structure including Hall sensors and a sensor flexible printed circuit board (FPCB), wherein the Hall sensors are disposed on the sensor FPCB and configured to detect a magnetic field of the at least one magnet on the support plate coupled to the second housing;

a guide member configured to protrude toward a rear side of the electronic device, wherein a lateral side of a protruded portion of the guide member faces the lateral side of the support plate at which the magnet is disposed, and wherein the at least one Hall sensor is disposed at the lateral side of the protruded portion of the guide member through the sensor FPCB and faces the lateral side of the support plate, memory storing instructions;

a printed circuit board (PCB) disposed in the first housing; and at least one processor disposed on the PCB and electrically connected to the Hall sensor structure, wherein the at least one magnet has a length shorter than the first distance between the Hall sensors, and is longer than half of the first distance, and wherein the instructions, when being executed by the at least one processor individually or collectively, cause the electronic device to:

receive, via the PCB and the FPCB, a signal detected by the Hall sensors indicative of a relative position of the second housing with respect to the first housing, and identify a moving distance which the second housing slides with respect to the first housing based on the detection of the magnetic field obtained by the Hall sensors.

17. The electronic device of claim 16, wherein the electronic device includes one of a first state in which the second housing is drawn into the housing and a second state in which the second housing is drawn out of the housing, and the Hall sensor structure includes a first Hall sensor disposed adjacent to the at least one magnet based on the electronic device being in the first state, a second Hall sensor spaced apart from the first Hall sensor by the first distance, and a third Hall sensor spaced apart from the second Hall sensor by the first distance and disposed adjacent to the at least one magnet based on the electronic device being in the second state.

18. The electronic device of claim 17, wherein the at least one magnet is spaced apart from the first Hall sensor by a second distance in the first direction in the first state, and the second distance is less than half of the first distance.

19. The electronic device of claim 16, wherein the at least one magnet includes a first magnet and a second magnet spaced apart from the first magnet by a third distance, and the first magnet and the second magnet are aligned in a row in the first direction.

20. The electronic device of claim 19, wherein N poles or S poles of the first magnet and the second magnet are aligned in mutually opposite directions.

* * * * *